(12) United States Patent
Odoi et al.

(10) Patent No.: US 11,282,975 B2
(45) Date of Patent: Mar. 22, 2022

(54) SHEET SET FOR ENCAPSULATING SOLAR BATTERY

(71) Applicant: MITSUI CHEMICALS TOHCELLO, INC., Chiyoda-ku (JP)

(72) Inventors: Masaaki Odoi, Hitachinaka (JP);
Nobuhiro Maruko, Ichihara (JP);
Kazuhiro Yarimizu, Fujisawa (JP);
Shigenobu Ikenaga, Chiba (JP); Kaoru Ohshimizu, Ichihara (JP)

(73) Assignee: MITSUI CHEMICALS TOHCELLO, INC., Tokyo (JP)

( * ) Notice: Subject to any disclaimer, the term of this patent is extended or adjusted under 35 U.S.C. 154(b) by 721 days.

(21) Appl. No.: 14/381,055

(22) PCT Filed: Feb. 22, 2013

(86) PCT No.: PCT/JP2013/001012
§ 371 (c)(1),
(2) Date: Aug. 26, 2014

(87) PCT Pub. No.: WO2013/128861
PCT Pub. Date: Sep. 6, 2013

(65) Prior Publication Data
US 2015/0013768 A1    Jan. 15, 2015

(30) Foreign Application Priority Data

Feb. 29, 2012  (JP) .............................. JP2012-044739
Apr. 6, 2012  (JP) .............................. JP2012-087734

(51) Int. Cl.
*H01L 31/048*  (2014.01)
*C08F 210/02*  (2006.01)
(Continued)

(52) U.S. Cl.
CPC .......... *H01L 31/048* (2013.01); *C08F 210/02* (2013.01); *C08F 210/16* (2013.01);
(Continued)

(58) Field of Classification Search
CPC ............... H01L 31/048; H01L 31/0481; H01L 31/0487; H01L 31/0488; H01L 31/049;
(Continued)

(56) References Cited

U.S. PATENT DOCUMENTS 5,874,513 A * 2/1999 Watanabe ............... B32B 27/32
526/153
2002/0038664 A1  4/2002 Zenko et al.
(Continued)

FOREIGN PATENT DOCUMENTS

CN  102027061 A  4/2011
CN  102037570 A  4/2011
(Continued)

OTHER PUBLICATIONS

Shioda, Tsuyoshi, Volume Resistivity of EVA Encapsulant Sheet, PV Module Reliability Workshop @ Golden, CO, Feb. 16-17, 2011, p. 1-7.*
(Continued)

*Primary Examiner* — Michael Y Sun
(74) *Attorney, Agent, or Firm* — Buchanan Ingersoll & Rooney PC

(57) ABSTRACT

A sheet set for encapsulating a solar battery including a first encapsulating sheet and a second encapsulating sheet which are disposed between a light-incident surface protective member and a back surface protective member, and are used to encapsulate solar battery elements is provided. When the first encapsulating sheet and the second encapsulating sheet are subjected to a heating and pressurization treatment in which the first encapsulating sheet and the second encapsu-
(Continued)

lating sheet are heated and depressurized under defined conditions, a volume resistivity of the first encapsulating sheet measured under defined conditions, is higher than a volume resistivity of the second encapsulating sheet. The first encapsulating sheet is disposed between the light-incident surface protective member and the solar battery elements. The second encapsulating sheet has at least one polar group selected from a carboxyl group, an ester group, a hydroxyl group, an amino group, and an acetal group.

19 Claims, 4 Drawing Sheets

(51) Int. Cl.
  *C08F 210/16* (2006.01)
  *C09D 123/08* (2006.01)
  *C08F 220/06* (2006.01)
  *C08F 218/08* (2006.01)

(52) U.S. Cl.
  CPC . *C09D 123/0815* (2013.01); *C09D 123/0853* (2013.01); *H01L 31/0481* (2013.01); *H01L 31/0488* (2013.01); *C08F 218/08* (2013.01); *C08F 220/06* (2013.01); *C08F 2500/08* (2013.01); *C08F 2500/12* (2013.01); *C08L 2203/204* (2013.01); *C08L 2312/00* (2013.01); *Y02E 10/50* (2013.01)

(58) Field of Classification Search
  CPC ........ C09D 123/0853; C09D 123/0815; C08F 210/16; C08F 210/02; C08F 218/08; C08F 220/06; C08F 2500/08; C08F 2500/12; C08L 2312/00; C08L 2203/204; Y02E 10/50
  See application file for complete search history.

(56) References Cited

U.S. PATENT DOCUMENTS

| | | | | |
|---|---|---|---|---|
| 2002/0132956 A1* | 9/2002 | Matayoshi | .......... | C08L 23/0815 528/192 |
| 2007/0043248 A1* | 2/2007 | Wu | ............................ | C07C 5/05 585/521 |
| 2007/0251572 A1* | 11/2007 | Hoya | ................... | C08L 23/0815 136/256 |
| 2008/0099064 A1* | 5/2008 | Hayes | ............... | B32B 17/10036 136/251 |
| 2009/0137383 A1* | 5/2009 | Tang | ..................... | C07C 211/45 502/62 |
| 2009/0288701 A1 | 11/2009 | Hayes et al. | | |
| 2010/0108127 A1 | 5/2010 | Hayes | | |
| 2010/0139740 A1* | 6/2010 | Xavier | .................. | H01L 31/048 136/251 |
| 2011/0061735 A1 | 3/2011 | Nishijima | | |
| 2011/0171451 A1 | 7/2011 | Aruga | | |
| 2011/0232757 A1* | 9/2011 | Kim | ........................ | F24S 80/40 136/259 |
| 2011/0272026 A1* | 11/2011 | Nishijima | ............... | B32B 27/18 136/259 |
| 2011/0319566 A1* | 12/2011 | Nishijima | ............... | C08L 23/04 525/194 |
| 2012/0000514 A1 | 1/2012 | Amamiya et al. | | |
| 2012/0247559 A1* | 10/2012 | Nakamura | .......... | H01L 31/0481 136/259 |
| 2012/0285529 A1* | 11/2012 | Kataoka | ................ | C08F 255/02 136/256 |
| 2012/0305080 A1* | 12/2012 | Funayama | ............ | H01L 31/048 136/259 |

FOREIGN PATENT DOCUMENTS

| | | | | |
|---|---|---|---|---|
| JP | 2006-210405 A | 8/2006 | | |
| JP | 2010-059259 A | 3/2010 | | |
| JP | 2010-272658 A | 12/2010 | | |
| JP | 2011-521478 A | 7/2011 | | |
| JP | 2011-153286 A | 8/2011 | | |
| JP | 2011155238 A | * 8/2011 | ......... | H01L 31/0481 |
| JP | 2011-228435 A | 11/2011 | | |
| JP | 2012-15402 A | 1/2012 | | |
| KR | 2011-0082126 A | 7/2011 | | |
| TW | M410994 U1 | 9/2011 | | |
| WO | WO 2008/036708 A2 | 3/2008 | | |
| WO | WO 2009/143407 A2 | 11/2009 | | |
| WO | WO 2010/051422 A1 | 5/2010 | | |

OTHER PUBLICATIONS

"IPC Solar SubCommittee" "Acceptability Guidlines for Solar Panel Lamination" Oct. 24, 2009, p. 1-28.*
Extended Search Report issued by the European Patent Office in corresponding European Patent Application No. 13754785 dated Jun. 25, 2015 (4 pages).
Office Action issued by the Korean Patent Office in corresponding Korean Patent Application No. 10-2014-7026741 dated Jan. 29, 2016 (10 pages).
International Search Report (PCT/ISA/210) dated Mar. 19, 2013, by the Japanese Patent Office as the International Searching Authority for International Application No. PCT/JP2013/001012.
Office Action issued by the Chinese Patent Office in corresponding Chinese Patent Application No. 201380011142.1 dated Oct. 29, 2015 (9 pages).
Office Action issued by the Taiwanese Patent Office in corresponding Taiwanese Patent Application No. 102106540 dated Oct. 24, 2016 (10 pages).

* cited by examiner

SHEET SET FOR ENCAPSULATING SOLAR BATTERY

TECHNICAL FIELD

The present invention relates to a sheet set for encapsulating a solar battery.

BACKGROUND ART

A solar battery module is manufactured by laminating a light-incident surface protective member, a solar battery encapsulating sheet, a solar battery cell, a solar battery encapsulating sheet, and a back surface protective member in this order, and curing the solar battery encapsulating sheet through crosslinking by heating and pressurizing the laminate.

An ethylene/vinyl acetate copolymer (EVA) film is widely used as the solar battery encapsulating sheet due to its excellent transparency, flexibility, adhesiveness, and the like.

In addition, Patent Document 1 proposes an encapsulating sheet for a solar battery which contains an ethylene/vinyl acetate copolymer, an ionomer of an ethylene/unsaturated carboxylic acid copolymer, and an organic peroxide, and does not cause the deterioration of solar battery elements due to corrosion and the degradation of the power generation performance of the solar battery element even in a case in which the solar battery elements are used for a long period of time under conditions of a high temperature and a high humidity.

In addition, Patent Document 2 proposes a resin composition for a solar battery encapsulating material which contains an ethylene/α-olefin copolymer, an ethylene functional group-containing monomer copolymer, and an organic peroxide, and is excellent in terms of extrusion productivity, transparency, heat resistance, and adhesiveness to glass.

RELATED DOCUMENT

Patent Document

[Patent Document 1] Japanese Unexamined Patent Publication No. 2010-59259
[Patent Document 2] Japanese Unexamined Patent Publication No. 2011-153286

DISCLOSURE OF THE INVENTION

Recently, in accordance with an increase in the size of a power generation system, such as a mega solar power generation system, there has been a movement to increase the voltage of the system. Generally, since the frame of a solar battery module is grounded, the potential difference between the frame and a cell serves as the system voltage, and therefore an increase in the system voltage increases the potential difference between the frame and the cell. In addition, glass, which is used for a light-incident surface protective member, has a lower electrical resistance compared with an encapsulating layer formed of a solar battery encapsulating sheet, and a high voltage is generated even between the light-incident surface protective member and the cell through the frame. That is, in modules connected in series, the potential difference between the cell and the module frame and the potential difference between the cell and the glass surface gradually increase from the ground side, and the potential difference on the high voltage side of the system voltage is rarely changed in a portion with the largest potential difference. In a solar battery module used in the above-described state, a potential induced degradation (PID) phenomenon in which the output is significantly decreased and the characteristics deteriorate becomes likely to occur. As a result, there is a demand for the improvement of a volume resistivity of the solar battery encapsulating sheet to solve the above-described problem.

However, according to the present inventors' studies, the encapsulating sheet for a solar battery described in Patent Document 1 has a great content of an ethylene/vinyl acetate copolymer, and is capable of sufficiently suppressing the generation of air bubbles, but has an insufficient volume resistivity, and is thus incapable of suppressing the PID phenomenon.

The resin composition for a solar battery encapsulating material described in Patent Document 2 is incapable of sufficiently suppressing the generation of air bubbles in a module, and therefore there is a case in which the solar battery encapsulating material is peeled from a solar battery element or the solar battery element cracks.

The invention has been made in consideration of the above-described circumstances, and an object of the invention is to provide a sheet for encapsulating a solar battery capable of satisfying both the suppression of the occurrence of the PID in a module and the suppression of the generation of air bubbles.

The inventors carried out intensive studies to achieve the above-described object, and found that it was possible to suppress the occurrence of the PID in a module by setting the volume resistivity to be relatively high after the heating and pressurization treatment (also referred to as a crosslinking treatment in a case in which a crosslinking reaction is followed) of a sheet for encapsulating a solar battery disposed between a light-incident surface protective member and solar battery elements. In addition, the inventors also found that the generation of air bubbles could be suppressed using a sheet for encapsulating a solar battery having a polar group. Therefore, the inventors found that it was possible to satisfy both the suppression of the occurrence of the PID and the suppression of the generation of air bubbles by encapsulating the solar battery elements using a combination of the sheet for encapsulating a solar battery with a relatively high volume resistivity and the sheet for encapsulating a solar battery having a polar group.

According to the invention, there is provided a sheet set for encapsulating a solar battery including a first encapsulating sheet and a second encapsulating sheet which are disposed between a light-incident surface protective member and a back surface protective member, and are used to encapsulate solar battery elements, in which, when the first encapsulating sheet and the second encapsulating sheet are subjected to a heating and pressurization treatment in which the first encapsulating sheet and the second encapsulating sheet are heated and depressurized at 150° C. and 250 Pa for three minutes, and then are heated and pressurized at 150° C. and 100 kPa for 15 minutes, a volume resistivity of the first encapsulating sheet, which is based on JIS K6911 and is measured at a temperature of 100° C. with an applied voltage of 500 V, is higher than a volume resistivity of the second encapsulating sheet, the first encapsulating sheet is disposed between the light-incident surface protective member and the solar battery elements, and the second encapsulating sheet has at least one polar group selected from a carboxyl group, an ester group, a hydroxyl group, an amino group, and an acetal group.

According to the invention, there is provided a solar battery module which includes an encapsulating layer between a light-incident surface protective member and a back surface protective member, and is formed by encapsulating solar battery elements in the encapsulating layer, in which the encapsulating layer includes a first encapsulating layer and a second encapsulating layer, a volume resistivity of the first encapsulating layer, which is based on JIS K6911 and is measured at a temperature of 100° C. with an applied voltage of 500 V, is higher than a volume resistivity of the second encapsulating layer, the second encapsulating layer has at least one polar group selected from a carboxyl group, an ester group, a hydroxyl group, an amino group, and an acetal group, and the first encapsulating layer is provided between the light-incident surface protective member and the solar battery elements.

According to the invention, there is provided a sheet for encapsulating a solar battery capable of satisfying both the suppression of the occurrence of the PID in a module and the suppression of the generation of air bubbles.

BRIEF DESCRIPTION OF THE DRAWINGS

The above-described object, other objects, characteristics, and advantages will be further clarified using preferred embodiments described below and the following drawings accompanied by the embodiments.

DESCRIPTION OF EMBODIMENTS

Figure 1:
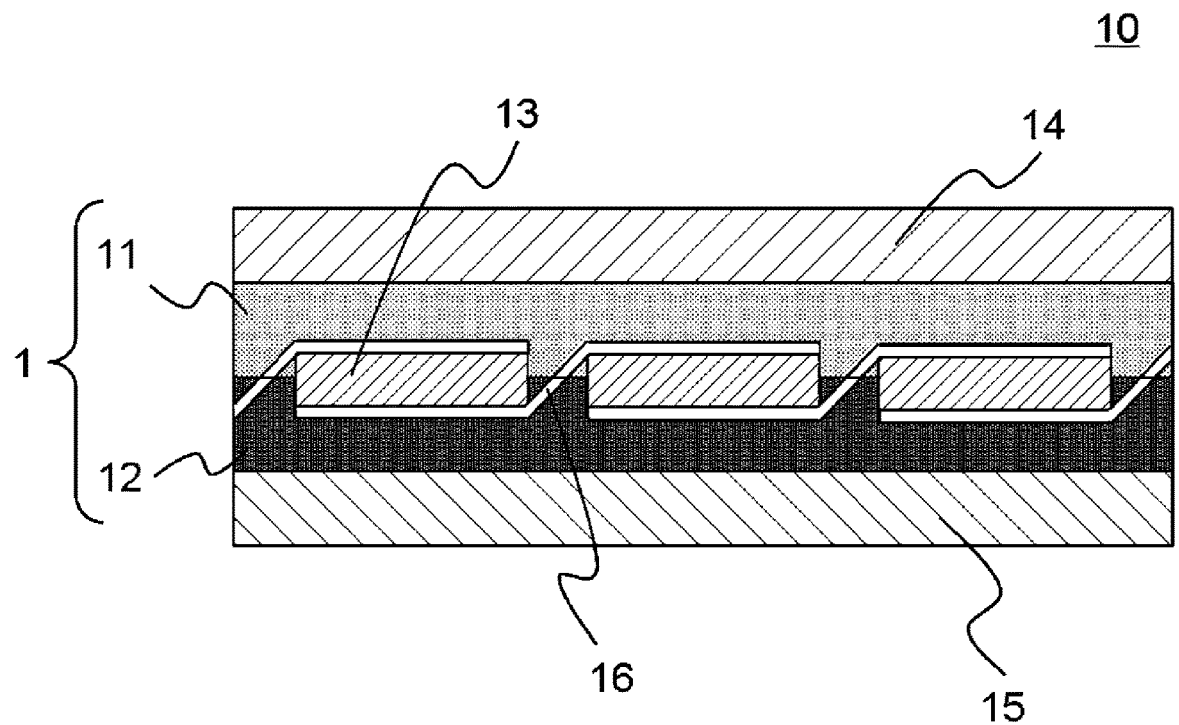
FIG. 1 is a cross-sectional view schematically illustrating a first embodiment of a solar battery module of the invention.

Hereinafter, the embodiments of the invention will be described using the drawings. Further, in all the drawings, the same components will be given the same reference numerals and will not be repeated.

The invention is a sheet set for encapsulating a solar battery including a first encapsulating sheet and a second encapsulating sheet which are disposed between a light-incident surface protective member and a back surface protective member, and are used to encapsulate solar battery elements. The sheet set for encapsulating a solar battery is configured so that the volume resistivity of the first encapsulating sheet becomes higher than the volume resistivity of the second encapsulating sheet.

In addition, the first encapsulating sheet is disposed between the light-incident surface protective member and the solar battery elements. The second encapsulating sheet has at least one polar group selected from a carboxyl group, an ester group, a hydroxyl group, an amino group, and an acetal group.

In the invention, the "volume resistivity" is based on JIS K6911 and is measured at a temperature of 100° C. with an applied voltage of 500 V. The volume resistivity of the first encapsulating sheet and the second encapsulating sheet is measured using a first encapsulating sheet and a second encapsulating sheet which have been subjected to a heating and pressurization treatment in which the first encapsulating sheet and the second encapsulating sheet are heated and depressurized at 150° C. and 250 Pa for three minutes, and then are heated and pressurized at 150° C. and 100 kPa for 15 minutes.

Specifically, the ratio ($R_1/R_2$) of the volume resistivity $R_1$ ($\Omega \cdot cm$) of the heated and pressurized first encapsulating sheet to the volume resistivity $R_2$ ($\Omega \cdot cm$) of the heated and pressurized second encapsulating sheet is preferably in a range of $1 \times 10^1$ to $1 \times 10^{10}$, and more preferably in a range of $1 \times 10^1$ to $1 \times 10^5$. Then, it is possible to suppress the occurrence of the PID in a solar battery module and to suppress the generation of air bubbles.

The volume resistivity ($R_1$) of the heated and pressurized first encapsulating sheet is preferably in a range of $1 \times 10^{13}$ $\Omega \cdot cm$ to $1 \times 10^{18}$ $\Omega \cdot cm$, and more preferably in a range of $1 \times 10^{14}$ $\Omega \cdot cm$ to $1 \times 10^{16}$ $\Omega \cdot cm$. In addition, the volume resistivity ($R_2$) of the heated and pressurized second encapsulating sheet is preferably in a range of $1 \times 10^8$ $\Omega \cdot cm$ to $1 \times 10^{15}$ $\Omega \cdot cm$, and more preferably in a range of $1 \times 10^{12}$ $\Omega \cdot cm$ to $1 \times 10^{15}$ $\Omega \cdot cm$. When $R_1$ and $R_2$ are set within the above-described ranges, it is possible to suppress the occurrence of the PID in the solar battery module for a longer period of time.

When the second encapsulating sheet is heated and depressurized at 150° C. and 250 Pa for three minutes, and then is heated and pressurized at 150° C. and 100 kPa for 15 minutes, the acetone-absorbing ratio ($A_2$) of the heated and pressurized second encapsulating sheet is preferably in a range of 7 weight % to 400 weight %, and more preferably in a range of 8 weight % to 200 weight % with respect to the weight of the heated and pressurized second encapsulating sheet before being immersed in acetone. Then, it is possible to sufficiently absorb the decomposed organic peroxide, to suppress the generation of air bubbles in the solar battery module, to improve the volume resistivity at 100° C., and to suppress the occurrence of the PID phenomenon. The acetone-absorbing ratio ($A_2$) of the heated and pressurized second encapsulating sheet is more preferably in a range of 10 weight % to 50 weight %, and still more preferably in a range of 15 weight % to 30 weight %. When the acetone-absorbing ratio is set to equal to or less than 50 weight %, it is possible to more reliably suppress the generation of air bubbles in a cooling step during the lamination of the module.

In the invention, the acetone-absorbing ratio is an index indicating the degree of the decomposed organic peroxide, which is generated by the heating and pressurization treatment (crosslinking treatment) of the solar battery encapsulating sheet, that can be absorbed (dissolved) in the solar battery encapsulating sheet. To obtain the acetone-absorbing ratio after the heating and pressurization treatment, the first and second encapsulating sheets are heated and pressurized by being heated and depressurized at 150° C. and 250 Pa for three minutes, and then being heated and pressurized at 150° C. and 100 kPa for 15 minutes, 10 ml of acetone is fed into, for example, a 100 ml closed container, and approximately 1 g of the heated and pressurized first encapsulating sheet and approximately 1 g of the heated and pressurized second encapsulating sheet, which are weighed using a precision scale, are cut and put into the closed container so as to be sufficiently immersed in acetone. The thickness of a test specimen is preferably set in a range of 0.3 mm to 1.2 mm. Next, the closed container including the first and second encapsulating sheets is put into a constant temperature bath such as an incubator at 30° C. for one hour. After that, acetone attached to the sheet surface is wiped away using KIMWIPE or the like, the sheet after the test is weighed using the precision scale within five minutes from the wiping, and the acetone-absorbing amounts of the respective sheets are computed from the difference in weight before and after the immersion in acetone. The percentage of the computed acetone-absorbing amount with respect to the weight of the heated and pressurized first or second encapsulating sheet before the absorption of acetone is considered as the acetone-absorbing ratio.

The acetone-absorbing ratio ($A_2$) of the heated and pressurized second encapsulating sheet is preferably greater than the acetone-absorbing ratio ($A_1$) of the first encapsulating sheet heated and pressurized by being heated and depressurized at 150° C. and 250 Pa for three minutes, and then being heated and pressurized at 150° C. and 100 kPa for 15 minutes. Specifically, the difference ($A_2-A_1$) between the acetone-absorbing ratio ($A_2$) of the heated and pressurized second encapsulating sheet and the acetone-absorbing ratio ($A_1$) of the heated and pressurized first encapsulating sheet is preferably in a range of 10 to 170, more preferably in a range of 12 to 120, and still more preferably in a range of 15 to 100.

The t-butanol-absorbing ratio ($B_2$) of the second encapsulating sheet heated and pressurized by being heated and depressurized at 150° C. and 250 Pa for three minutes, and then being heated and pressurized at 150° C. and 100 kPa for 15 minutes is preferably in a range of 4 weight % to 30 weight % with respect to the weight of the heated and pressurized second encapsulating sheet before being immersed in t-butanol. Then, it is possible to sufficiently absorb the decomposed organic peroxide, to suppress the generation of air bubbles in the solar battery module, to improve the volume resistivity at 100° C., and to suppress the occurrence of the PID phenomenon. The t-butanol-absorbing ratio ($B_2$) of the heated and pressurized second encapsulating sheet is more preferably in a range of 4 weight % to 25 weight %, and still more preferably in a range of 7.5 weight % to 20 weight %. When the t-butanol-absorbing ratio is set to equal to or less than 25 weight %, it is possible to more reliably suppress the generation of air bubbles in a cooling step during the lamination of the module.

In the invention, similar to the acetone-absorbing ratio, the t-butanol-absorbing ratio is also an index indicating the degree of the decomposed organic peroxide, which is generated by the heating and pressurization treatment of the solar battery encapsulating sheet, that can be absorbed (dissolved) in the solar battery encapsulating sheet. In a case in which the t-butanol-absorbing ratio after the heating and pressurization treatment is obtained as well, similar to the acetone-absorbing ratio, the first and second encapsulating sheets are heated and pressurized by being heated and depressurized at 150° C. and 250 Pa for three minutes, and then being heated and pressurized at 150° C. and 100 kPa for 15 minutes, 10 ml of t-butanol is fed into, for example, a 100 ml closed container, and approximately 1 g of the heated and pressurized first encapsulating sheet and approximately 1 g of the heated and pressurized second encapsulating sheet, which are weighed using a precision scale, are cut and put into the closed container so as to be sufficiently immersed in t-butanol. The thickness of the test specimen is preferably set in a range of 0.3 mm to 1.2 mm. In a case in which the t-butanol-absorbing ratio is measured, the closed container including the first and second encapsulating sheets is put into a constant temperature device or the like, and the temperature is maintained at 30° C. for one hour.

After that, t-butanol attached to the sheet surface is wiped away using KIMWIPE or the like, the sheet after the test is weighed using the precision scale within five minutes from the wiping, and the t-butanol-absorbing amounts of the respective sheets are computed from the difference in weight before and after the immersion in t-butanol. The percentage of the computed t-butanol-absorbing amount with respect to the weight of the heated and pressurized first or second encapsulating sheet before the absorption of t-butanol is considered as the t-butanol-absorbing ratio.

The t-butanol-absorbing ratio ($B_2$) of the heated and pressurized second encapsulating sheet is preferably greater than the t-butanol-absorbing ratio ($B_1$) of the first encapsulating sheet heated and pressurized by being heated and depressurized at 150° C. and 250 Pa for three minutes, and then being heated and pressurized at 150° C. and 100 kPa for 15 minutes. Specifically, the difference ($B_2-B_1$) between the t-butanol-absorbing ratio ($B_2$) of the heated and pressurized second encapsulating sheet and the t-butanol-absorbing ratio ($B_1$) of the heated and pressurized first encapsulating sheet is preferably in a range of 5 to 40, more preferably in a range of 5 to 30, and still more preferably in a range of 7 to 20.

The first encapsulating sheet preferably contains an ethylene-based copolymer as a crosslinkable resin, and the ethylene-based copolymer is preferably a resin selected from a group consisting of an ethylene/α-olefin copolymer and an ethylene/polar monomer copolymer.

As the first encapsulating sheet, an ethylene/α-olefin copolymer or an ethylene/polar monomer copolymer may be solely used, or a blend of an ethylene/α-olefin copolymer and an ethylene/polar monomer copolymer may be used. In a case in which a blend of an ethylene/α-olefin copolymer and an ethylene/polar monomer copolymer is used, it is preferable that the ethylene/α-olefin copolymer be in a range of 50 parts by weight to 99 parts by weight and the ethylene/polar monomer copolymer be in a range of 1 part by weight to 50 parts by weight, it is more preferable that the ethylene/α-olefin copolymer be in a range of 50 parts by weight to 98 parts by weight and the ethylene/polar monomer copolymer be in a range of 2 parts by weight to 50 parts by weight, it is still more preferable that the ethylene/α-olefin copolymer be in a range of 50 parts by weight to 95 parts by weight and the ethylene/polar monomer copolymer be in a range of 5 parts by weight to 50 parts by weight, and it is particularly preferable that the ethylene/α-olefin copolymer be in a range of 75 parts by weight to 95 parts by weight and the ethylene/polar monomer copolymer be in a range of 5 parts by weight to 25 parts by weight with respect to a total of 100 parts by weight of the ethylene/α-olefin copolymer and the ethylene/polar monomer copolymer.

The second encapsulating sheet contains at least one polar group selected from a carboxylic group, an ester group, a hydroxyl group, an amino group, and an acetal group, and the second encapsulating sheet preferably contains at least one polar group selected from a carboxylic group and an ester group since it is possible to effectively suppress the generation of air bubbles in the module. Specifically, it is possible to contain a crosslinkable resin containing one or more of the above-described polar groups in the sheet.

The crosslinkable resin used for the second encapsulating sheet preferably contains a resin selected from a group consisting of an ethylene/polar monomer copolymer, polyvinyl acetal, and polyvinyl butyral, and more preferably contains an ethylene/polar monomer copolymer. Examples of the ethylene/polar monomer copolymer include an ethylene/vinyl acetate copolymer, an ethylene/acrylic acid ester copolymer, an ethylene/acrylic acid copolymer, an ethylene/methacrylic acid ester copolymer, an ethylene/methacrylic acid copolymer, an ethylene/acrylic acid ionomer, an ethylene/methacrylic acid ionomer, an ethylene/maleic acid copolymer, an ethylene/vinyl alcohol copolymer, and the like, the crosslinkable resin preferably contains an ethylene/vinyl acetate copolymer. It is also possible to use one or more of the above-described resins. The ethylene/polar monomer copolymer can also be used after being blended with an ethylene/α-olefin copolymer. In this case, it is preferable that the ethylene/α-olefin copolymer be in a range of 1 part by weight to 50 parts by weight and the ethylene/polar monomer copolymer be in a range of 50 parts by weight to 99 parts by weight, it is more preferable that the ethylene/α-olefin copolymer be in a range of 2 parts by weight to 50 parts by weight and the ethylene/polar monomer copolymer be in a range of 50 parts by weight to 98 parts by weight, it is still more preferable that the ethylene/α-olefin copolymer be in a range of 5 parts by weight to 50 parts by weight and the ethylene/polar monomer copolymer be in a range of 50 parts by weight to 95 parts by weight, and it is particularly preferable that the ethylene/α-olefin copolymer be in a range of 5 parts by weight to 25 parts by weight and the ethylene/polar monomer copolymer be in a range of 75 parts by weight to 95 parts by weight with respect to a total of 100 parts by weight of the ethylene/α-olefin copolymer and the ethylene/polar monomer copolymer.

In the sheet set for encapsulating a solar battery of the invention, the crosslinkable resin is preferably a combination of an ethylene/α-olefin copolymer used for the first encapsulating sheet and polyvinyl butyral used for the second encapsulating sheet, a combination of an ethylene/α-olefin copolymer used for the first encapsulating sheet and an ethylene/polar monomer copolymer used for the second encapsulating sheet, a combination of an ethylene/polar monomer copolymer used for the first encapsulating sheet and an ethylene/polar monomer copolymer used for the second encapsulating sheet, and a combination of an ethylene/α-olefin copolymer used for the first encapsulating sheet and an ethylene/α-olefin copolymer used for the second encapsulating sheet, and, among the above-described combinations, the combination of an ethylene/α-olefin copolymer used for the first encapsulating sheet and an ethylene/polar monomer copolymer used for the second encapsulating sheet is preferred.

The sheet set for encapsulating a solar battery of the invention may include one first encapsulating sheet and one second encapsulating sheet, may include multiple first encapsulating sheets or multiple second encapsulating sheets, or may include multiple first encapsulating sheets and multiple second encapsulating sheets. In addition, the first and second encapsulating sheets may be laminated, and the sheet set may include a laminate of the first and second encapsulating sheets and at least one of the first and second encapsulating sheets.

The ethylene/α-olefin copolymer used for the first and second encapsulating sheets is obtained by copolymerizing ethylene and an α-olefin having 3 to 20 carbon atoms. Generally, it is possible to solely use an α-olefin having 3 to 20 carbon atoms or to use a combination of two or more α-olefins having 3 to 20 carbon atoms as the α-olefin. Examples of the α-olefin having 3 to 20 carbon atoms include straight or branched α-olefins such as propylene, 1-butene, 2-butene, 1-pentene, 3-methyl-1-butene, 3,3-dimethyl-1-butene, 1-hexene, 4-methyl-1-pentene, 3-methyl-1-pentene, 1-octene, 1-decene, and 1-dodecene. Among the above-described α-olefins, an α-olefin having 10 or less carbon atoms is preferred, and an α-olefin having 3 to 8 carbon atoms is particularly preferred. Propylene, 1-butene, 1-pentene, 1-hexene, 4-methyl-1-pentene, and 1-octene are preferred in terms of easy procurement. Meanwhile, the ethylene/α-olefin copolymer may be a random copolymer or a block copolymer, and is preferably a random copolymer from the viewpoint of flexibility.

The ethylene/α-olefin copolymer used for the first and second encapsulating sheets may be a copolymer composed of ethylene, an α-olefin having 3 to 20 carbon atoms, and an unconjugated polyene. The α-olefin is the same as described above, and examples of the unconjugated polyene include 5-ethylidene-2-norbornene (ENB), 5-vinyl-2-norbornene (VNB), dicyclopentadiene (DCPD), and the like. The unconjugated polyene can be solely used, or a combination of two or more unconjugated polyenes can be used.

The ethylene/α-olefin copolymer used for the first and second encapsulating sheets may be jointly used with an aromatic vinyl compound, for example, styrene such as styrene, o-methyl styrene, m-methyl styrene, p-methyl styrene, o,p-dimethyl styrene, methoxy styrene, vinylbenzoic acid, methyl vinylbenzoate, vinylbenzyl acetate, hydroxystyrene, p-chlorostyrene, and divinylbenzene; 3-phenyl propylene, 4-phenyl propylene, α-methyl styrene, a cyclic olefin having 3 to 20 carbon atoms, for example, cyclopentene, cycloheptene, norbornene, and 5-methyl-2-norbornene.

The ethylene/α-olefin copolymer used for the first and second encapsulating sheets preferably satisfies at least one of the following a1) to a4), more preferably satisfies two or more of the following a1) to a4), still more preferably satisfies three or more of the following a1) to a4), and particularly preferably satisfies all of the following a1) to a4).

a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and is measured under conditions of a temperature of 190° C. and a load of 2.16 kg, is in a range of 0.1 g/10 minutes to 50 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

a1) α-olefin Unit

The content ratio of a structural unit, which is contained in the ethylene/α-olefin copolymer used for the first and second encapsulating sheets and is derived from ethylene, is preferably in a range of 80 mol % to 90 mol %, more preferably in a range of 80 mol % to 88 mol %, still more preferably in a range of 82 mol % to 88 mol %, and particularly preferably in a range of 82 mol % to 87 mol %. The ratio of a structural unit (hereinafter, also referred to as "α-olefin unit"), which is contained in the ethylene/α-olefin copolymer and is derived from the α-olefin having 3 to 20 carbon atoms, is in a range of 10 mol % to 20 mol %, preferably in a range of 12 mol % to 20 mol %, more preferably in a range of 12 mol % to 18 mol %, and still more preferably in a range of 13 mol % to 18 mol %.

When the content ratio of the α-olefin unit contained in the ethylene/α-olefin copolymer is equal to or more than 10 mol %, high transparency can be obtained. In addition, it is possible to easily carry out extrusion-molding at a low temperature, for example, extrusion-molding at 130° C. or lower is possible. Therefore, even in a case in which the organic peroxide is forcibly inserted into the ethylene/α-olefin copolymer, it is possible to suppress the progress of a crosslinking reaction in an extruder, and to provide a favorable appearance to the first and second encapsulating sheets. In addition, since appropriate flexibility can be obtained, it is possible to prevent the occurrence of cracking in the solar battery element or the chipping of the thin film electrode during the lamination molding of the solar battery module.

When the content ratio of the α-olefin unit contained in the ethylene/α-olefin copolymer is equal to or less than 20 mol %, the crystallization rate of the ethylene/α-olefin copolymer becomes appropriate, and therefore a sheet extruded from an extruder does not become sticky, the sheet is easily peeled from a cooling roll, and it is possible to efficiently obtain a sheet for encapsulating a solar battery of the invention. In addition, since the sheet does not become sticky, blocking can be prevented, and the feeding property of the sheet is favorable. In addition, it is also possible to prevent the degradation of the heat resistance.

a2) MFR

The melt flow rate (MFR) of the ethylene/α-olefin copolymer used for the first and second encapsulating sheets is generally in a range of 0.1 g/10 minutes to 50 g/10 minutes, preferably in a range of 2 g/10 minutes to 50 g/10 minutes, more preferably in a range of 5 g/10 minutes to 50 g/10 minutes, still more preferably in a range of 10 g/10 minutes to 40 g/10 minutes, further more preferably in a range of 10 g/10 minutes to 27 g/10 minutes, and most preferably in a range of 15 g/10 minutes to 25 g/10 minutes. Meanwhile, MFR of the ethylene/α-olefin copolymer can be adjusted by adjusting the polymerization temperature, the polymerization pressure, the molar ratio between the monomer concentration and the hydrogen concentration in ethylene and the α-olefin in a polymerization system, and the like.

In the invention, MFR of the ethylene/α-olefin copolymer is based on ASTM D1238 and is measured under conditions of a temperature of 190° C. and a load of 2.16 kg.

When MFR is in a range of 0.1 g/10 minutes to 10 g/10 minutes, it is possible to manufacture the first and second encapsulating sheets through calendar molding. When MFR is in a range of 0.1 g/10 minutes to 10 g/10 minutes, the fluidity of a resin composition containing the ethylene/α-olefin copolymer is low, and therefore it is possible to prevent a lamination apparatus from being contaminated by the molten resin extracted when the first and second encapsulating sheets are laminated with the battery elements, which is preferable.

Furthermore, when MFR is equal to or more than 2 g/10 minutes, the fluidity of the resin composition improves, and production through sheet extrusion-molding is also possible. Furthermore, when MFR is equal to or more than 10 g/10 minutes, in a case in which the first and second encapsulating sheets are manufactured through extrusion-molding, the fluidity of the resin composition containing the ethylene/α-olefin copolymer improves, and it is possible to improve the productivity during sheet extrusion-molding.

In addition, when MFR is equal to or less than 50 g/10 minutes, the molecular weight is increased so that it is possible to suppress the attachment to a roll surface of a chilled roll or the like, and therefore peeling is not required, and it is possible to mold the first and second encapsulating sheets having a uniform thickness. Furthermore, since the resin composition becomes "stiff", it is possible to easily mold the first and second encapsulating sheets having a thickness of equal to or more than 0.3 mm. In addition, since the crosslinking characteristic is improved during the lamination molding of the solar battery module, the crosslinkable resin is sufficiently crosslinked so that the degradation of the heat resistance can be suppressed. When MFR is equal to or less than 27 g/10 minutes, furthermore, drawdown during the sheet molding can be suppressed, and therefore it is possible to mold the first and second encapsulating sheets having a wide width, to further improve the crosslinking characteristic and the heat resistance, and to obtain the most favorable first and second encapsulating sheets.

a3) Density

The density of the ethylene/α-olefin copolymer used for the first and second encapsulating sheets is preferably in a range of 0.865 g/cm$^3$ to 0.884 g/cm$^3$, more preferably in a range of 0.866 g/cm$^3$ to 0.883 g/cm$^3$, still more preferably in a range of 0.866 g/cm$^3$ to 0.880 g/cm$^3$, and particularly preferably in a range of 0.867 g/cm$^3$ to 0.880 g/cm$^3$. The density of the ethylene/α-olefin copolymer can be adjusted using the balance between the content ratio of the ethylene unit and the content ratio of the α-olefin unit. That is, when the content ratio of the ethylene unit is increased, the crystallinity becomes high, and it is possible to obtain an ethylene/α-olefin copolymer having a high density. On the other hand, when the content ratio of the ethylene unit is decreased, the crystallinity becomes low, and it is possible to obtain the ethylene/α-olefin copolymer having a low density.

In the invention, the density of the ethylene/α-olefin copolymer is measured on the basis of ASTM D1505.

When the density of the ethylene/α-olefin copolymer is equal to or less than 0.884 g/cm$^3$, the crystallinity becomes low, and it is possible to increase the transparency. Furthermore, extrusion-molding at a low temperature becomes easy, and, for example, it is possible to carry out extrusion-molding at 130° C. or lower. Therefore, even when the organic peroxide is forcibly inserted into the ethylene/α-olefin copolymer, it is possible to prevent the progress of a crosslinking reaction in an extruder, and to provide a favorable appearance to the sheet for encapsulating a solar battery. In addition, since the flexibility is high, it is possible to prevent the occurrence of cracking in a cell which is the solar battery element or the chipping of the thin film electrode during the lamination molding of the solar battery module.

On the other hand, when the density of the ethylene/α-olefin copolymer is equal to or more than 0.865 g/cm$^3$, it is possible to increase the crystallization rate of the ethylene/α-olefin copolymer, and therefore a sheet extruded from an extruder does not easily become sticky, peeling from the cooling roll becomes easy, and it is possible to easily obtain the sheet for encapsulating a solar battery of the invention. In addition, since the sheet does not easily become sticky, it is possible to suppress the occurrence of blocking and to improve the feeding property of the sheet. In addition, since the sheet is sufficiently crosslinked, it is possible to suppress the degradation of the heat resistance.

a4) Shore A Hardness

The shore A hardness of the ethylene/α-olefin copolymer used for the first and second encapsulating sheets is preferably in a range of 60 to 85, more preferably in a range of 62 to 83, still more preferably in a range of 62 to 80, and particularly preferably in a range of 65 to 80. The shore A hardness of the ethylene/α-olefin copolymer can be adjusted by adjusting the content ratio or density of the ethylene unit in the ethylene/α-olefin copolymer.

In the invention, the shore A hardness of the ethylene/α-olefin copolymer is measured on the basis of ASTM D2240.

When the shore A hardness is equal to or more than 60, the crystallization rate of the ethylene/α-olefin copolymer becomes appropriate, and therefore a sheet extruded from an extruder does not become sticky, peeling from the cooling roll is easy, and it is possible to efficiently obtain the sheet for encapsulating a solar battery of the invention. In addition, stickiness is not caused in the sheet, and therefore blocking can be prevented, and the feeding property of the sheet is favorable. In addition, it is also possible to prevent the degradation of the heat resistance.

On the other hand, when the shore A hardness is equal to or less than 85, high transparency can be obtained. In addition, it is possible to easily carry out extrusion-molding at a low temperature, for example, extrusion-molding at 130° C. or lower is possible. Therefore, even in a case in which the organic peroxide is forcibly inserted into the ethylene/α-olefin copolymer, it is possible to suppress the progress of a crosslinking reaction in an extruder, and to provide a favorable appearance to the sheet for encapsulating a solar battery of the invention. In addition, since appropriate flexibility can be obtained, it is possible to prevent the occurrence of cracking in the solar battery element or the chipping of the thin film electrode during the lamination molding of the solar battery module.

In addition, the ethylene/α-olefin copolymer used for the first and second encapsulating sheets more preferably further satisfies the following a5).

a5) The content of an aluminum element in the ethylene/α-olefin copolymer is in a range of 10 ppm to 500 ppm.

The content (residue amount) of an aluminum element (hereinafter, also expressed as "Al") contained in the ethylene/α-olefin copolymer used for the first and second encapsulating sheets is preferably in a range of 10 ppm to 500 ppm, more preferably in a range of 20 ppm to 400 ppm, and still more preferably in a range of 20 ppm to 300 ppm. The content of Al is dependent on the concentration of an organic aluminumoxy compound or an organic aluminum compound being added during the polymerization process of the ethylene/α-olefin copolymer.

In a case in which the content of Al is equal to or more than 10 ppm, the organic aluminumoxy compound or the organic aluminum compound can be added during the polymerization process of the ethylene/α-olefin copolymer at a concentration at which the activity of a metallocene compound is sufficiently developed, and therefore it becomes unnecessary to add a compound which reacts with the metallocene compound so as to form an ion pair. In a case in which the compound forming the ion pair is added, there is a case in which the compound forming the ion pair remains in the ethylene/α-olefin copolymer such that the electric characteristics are degraded (for example, there is a tendency of electric characteristics degrading at a high temperature of approximately 100° C.), which can be prevented. In addition, a decrease in the content of Al requires a decalcification treatment using an acid or an alkali, and the acid or the alkali remaining in the obtained ethylene/α-olefin copolymer tends to corrode the electrode. The decalcification treatment also increases the cost of the ethylene/α-olefin copolymer. However, when the content of Al is equal to or less than 500 ppm, the decalcification treatment becomes unnecessary.

In addition, when the content of Al is equal to or less than 500 ppm, it is possible to prevent the progress of the crosslinking reaction in an extruder, and therefore it is possible to provide a favorable appearance to the sheet for encapsulating a solar battery.

As a method for controlling the above-described aluminum element contained in the ethylene/α-olefin copolymer, for example, it is possible to control the aluminum element contained in the ethylene/α-olefin copolymer by adjusting the concentrations of (II-1) the organic aluminumoxy compound and (II-2) the organic aluminum compound described in the below-described method for manufacturing the ethylene/α-olefin copolymer in a manufacturing step or the polymerization activity of the metallocene compound which is a condition for manufacturing the ethylene/α-olefin copolymer.

The B value of the ethylene/α-olefin copolymer used for the first and second encapsulating sheets, which is obtained from the $^{13}$C-NMR spectrum and the following equation (1), is preferably in a range of 0.9 to 1.5, more preferably in a range of 0.9 to 1.3, still more preferably in a range of 0.95 to 1.3, particularly preferably in a range of 0.95 to 1.2, and most preferably in a range of 1.0 to 1.2. The B value can be adjusted by changing a polymerization catalyst when the ethylene/α-olefin copolymer is polymerized. More specifically, an ethylene/α-olefin copolymer having a B value in the above-described numeric range can be obtained using the metallocene compound described below.

$$B\text{value}=[P_{OE}]/(2\times[P_O]\times[P_E]) \qquad (1)$$

(In the equation (1), $[P_E]$ represents the proportion (molar fraction) of the structural unit derived from ethylene in the ethylene/α-olefin copolymer, $[P_O]$ represents the proportion (molar fraction) of the structural unit derived from an α-olefin having 3 to 20 carbon atoms in the ethylene/α-olefin copolymer, and $[P_{OE}]$ represents the proportion (molar fraction) of α-olefin/ethylene chains in all dyad chains.)

The B value is an index indicating the distribution state of the ethylene unit and the α-olefin unit in the ethylene/α-olefin copolymer, and can be obtained based on the report by J. C. Randall (Macromolecules, 15, 353 (1982)), J. Ray (Macromolecules, 10, 773 (1977)).

When the B value is equal to or more than 0.9, extrusion-molding at a low temperature becomes easy, for example, it is possible to carry out extrusion-molding at 130° C. or lower, and therefore it is possible to prevent the appearance of the sheet from deteriorating by suppressing the progress of the crosslinking reaction in an extruder.

The intensity ratio (Tαβ/Tαα) of Tαβ to Tαα of the ethylene/α-olefin copolymer used for the first and second encapsulating sheets in the $^{13}$C-NMR spectrum is preferably equal to or less than 1.5, more preferably equal to or less than 1.2, particularly preferably equal to or less than 1.0, and most preferably equal to or less than 0.7. Tαβ/Tαα can be adjusted by changing a polymerization catalyst when the ethylene/α-olefin copolymer is polymerized.

Here, Tαα and Tαβ in the $^{13}$C-NMR spectrum correspond to the peak intensities of "CH$_2$" in the structural unit derived from an α-olefin having 3 or more carbon atoms. More specifically, Tαα and Tαβ represent the peak intensities of two types of "CH$_2$" having different locations with respect to ternary carbon atoms respectively as illustrated in the following general formula (2).

[Chem. 1]

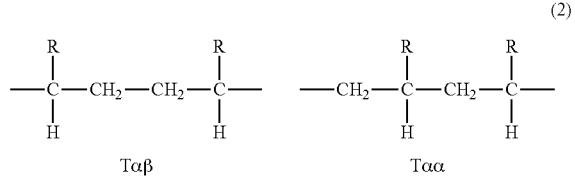

(2)

Tαβ/Tαα can be obtained in the following manner. The $^{13}$C-NMR spectrum of the ethylene/α-olefin copolymer is measured using an NMR measurement device (for example, trade name "JEOL-GX270" manufactured by JEOL, Ltd.). The measurement is carried out using a solution mixture of hexachlorobutadiene and d6-benzene (at a volume ratio of 2/1) which has been adjusted to provide a specimen concentration of 5 weight % and a standard of d6-benzene (128 ppm) at 67.8 MHz and 25° C. The measured $^{13}$C-NMR spectrum is analyzed according to Lindemann-Adams' proposal (Analysis Chemistry, 43, p 1245 (1971)), and J. C. Randall (Review Macromolecular Chemistry Physics, C29, 201 (1989)), and Tαβ/Tαα is obtained.

The molecular weight distribution Mw/Mn of the ethylene/α-olefin copolymer used for the first and second encapsulating sheets, which is represented by the ratio of the weight-average molecular weight (Mw) to the number-average molecular weight (Mn) measured through gel permeation chromatography (GPC), is preferably in a range of 1.2 to 3.5, more preferably in a range of 1.7 to 3.0, still more preferably in a range of 1.7 to 2.7, and particularly preferably in a range of 1.9 to 2.4. The molecular weight distribution Mw/Mn of the ethylene/α-olefin copolymer can be adjusted by changing the polymerization catalyst when the ethylene/α-olefin copolymer is polymerized.

When Mw/Mn is set to equal to or more than 1.2, it is possible to obtain the catalyst activity for polymerizing the ethylene/α-olefin copolymer in a living polymerization manner. Alternately, since it becomes unnecessary to separate the low molecular weight component and high molecular weight component of the ethylene/α-olefin copolymer obtained using a well-known polymerization method of the related art, it is possible to decrease the manufacturing cost. In addition, since the temperature width in which molding is possible is narrow, and furthermore, the ejection amount in an extruder becomes uniform, it is possible to obtain a sheet having a uniform thickness, and sheet molding becomes easy.

Generally, it is known that, when the molecular weight distribution Mw/Mn becomes wide, the composition distribution also becomes wide. However, when the Mw/Mn is equal to or less than 3.5, the amount of the low molecular weight component becomes small, and therefore the sheet does not become sticky and is not easily blocked so that the feeding property of the sheet can be improved. In addition, since the bleeding of the low molecular weight component onto the sheet surface is prevented, it is possible to suppress the degradation of the adhesiveness.

In the present specification, the ratio (Mw/Mn) of the weight-average molecular weight (Mw) to the number-average molecular weight (Mn) is measured in the following manner using a gel permeation chromatography manufactured by Waters (trade name: "ALLIANCE GPC-2000"). Two "TSKgel GMH6-HT" (trade name) columns and two "TSKgel GMH6-HTL" (trade name) columns are used as separation columns. Regarding the column size, an inner diameter of 7.5 mm and a length of 300 mm are provided to all columns, the column temperature is set to 140° C., o-dichlorobenzene (manufactured by Wako Pure Chemical Industries, Ltd.) is used as a mobile phase, and 0.025 weight % of BHT (manufactured by Takeda Pharmaceutical Company Limited) is used as an antioxidant. The mobile phase is moved at a rate of 1.0 ml/minute so as to set the specimen concentration to 15 mg/10 ml, the specimen injection amount is set to 500 μl, and a differential refractometer is used as a detector. Polystyrene manufactured by Tosoh Corporation is used as the standard polystyrene for the ethylene/α-olefin copolymer having a molecular weight of Mw<1000 and Mw>4×10$^6$. In addition, polystyrene manufactured by Pressure Chemical Corporation is used as the standard polystyrene for the ethylene/α-olefin copolymer having a molecular weight of 1000≤Mw≤4×10$^6$. The molecular weight is the value of the ethylene/α-olefin copolymer converted in accordance with each of the used α-olefins through universal correction.

The content ratio of chlorine ions in the ethylene/α-olefin copolymer used for the first and second encapsulating sheets, which is detected from an extraction liquid after a solid-phase extraction treatment through ion chromatography, is preferably equal to or less than 2 ppm, more preferably equal to or less than 1.5 ppm, and particularly preferably equal to or less than 1.2 ppm. The content ratio of chlorine ions can be adjusted by changing the polymerization catalyst or adjusting the polymerization conditions when the ethylene/α-olefin copolymer is polymerized.

When the content ratio of chlorine ions in the ethylene/α-olefin copolymer is set to equal to or less than 2 ppm, it is possible to prevent a problem of the long-term reliability of the solar battery module being degraded by the corrosion of an electrode made of silver or the like. Meanwhile, when a polymerization catalyst containing no chlorine atom is used, it is possible to obtain an ethylene/α-olefin copolymer substantially containing no chlorine ion.

The content ratio of chlorine ions in the ethylene/α-olefin copolymer can be measured using an extraction liquid, which is obtained by, for example, precisely weighing approximately 10 g of the ethylene/α-olefin copolymer in a glass container that has been sterilized and washed using an autoclave or the like, adding 100 ml of ultrapure water, closely encapsulating the glass container, and then carrying out ultrasonic wave (38 kHz) extraction at room temperature for 30 minutes, and an ion chromatography device manufactured by Dionex Ltd. (trade name "ICS-2000").

The extraction amount of the ethylene/α-olefin copolymer used for the first and second encapsulating sheets into methyl acetate is preferably equal to or less than 5.0 weight %, more preferably equal to or less than 4.0 weight %, still more preferably equal to or less than 3.5 weight %, and particularly preferably equal to or less than 2.0 weight %. A large extraction amount into methyl acetate indicates that a large amount of a low molecular weight component is contained in the ethylene/α-olefin copolymer and the molecular weight distribution or the composition distribution is wide. Therefore, it is possible to obtain the ethylene/α-olefin copolymer having a small extraction amount into methyl acetate by changing the polymerization catalyst or adjusting the polymerization conditions when the ethylene/α-olefin copolymer is polymerized.

The extraction amount into methyl acetate is computed by, for example, precisely weighing approximately 10 g of the ethylene/α-olefin copolymer, carrying out Soxhlet extraction using methyl acetate at a temperature that is equal to or higher than the boiling point of methyl acetate, and using the weight difference of the ethylene/α-olefin copolymer before and after the extrusion or the residue amount obtained after the extracted solvent is volatilized.

The differential scanning calorimetry (DSC)-based melting peak of the ethylene/α-olefin copolymer used for the first and second encapsulating sheets is preferably present in a range of 30° C. to 90° C., more preferably present in a range of 33° C. to 90° C., and particularly preferably present in a range of 33° C. to 88° C. When the melting peak is 90° C. or lower, the degree of crystallinity becomes low, and the flexibility of the obtained sheets becomes favorable, and therefore it is possible to prevent the occurrence of cracking in a cell or the chipping of the thin film electrode during the lamination molding of the solar battery module. On the other hand, when the melting peak is 30° C. or higher, it is possible to provide appropriately favorable flexibility to the resin composition, and therefore it is possible to easily obtain the encapsulating sheets through extrusion-molding. In addition, it is possible to prevent the sheet from becoming sticky and blocked, and to suppress the deterioration of the feeding property of the sheet.

The ethylene/α-olefin copolymer can be manufactured using a Ziegler compound, a vanadium compound, a metallocene compound, or the like as a catalyst. Among the above-described compounds, it is preferable to use any one of a variety of metallocene compounds described below as a catalyst when the ethylene/α-olefin copolymer is manufactured. Examples of the metallocene compounds that can be used include metallocene compounds described in Japanese Unexamined Patent Publication No. 2006-077261, Japanese Unexamined Patent Publication No. 2008-231265, Japanese Unexamined Patent Publication No. 2005-314680, and the like. However, a metallocene compound having a different structure from those of the metallocene compounds described in the above-described patent documents may also be used, and a combination of two or more metallocene compounds may also be used.

Preferable examples of a polymerization reaction in which the metallocene compound is used include the following aspects.

Ethylene and one or more monomers selected from α-olefins and the like are supplied in the presence of a catalyst for olefin polymerization composed of (I) a well-known metallocene compound of the related art and at least one compound (II) (also referred to as a promoter) selected from a group consisting of (II-1) the organic aluminumoxy compound, (II-2) compounds that react with the metallocene compound (I) so as to form an ion pair, and (II-3) the organic aluminum compound.

As (II) the compound, it is possible to use the metallocene compounds described in Japanese Unexamined Patent Publication No. 2006-077261, Japanese Unexamined Patent Publication No. 2008-231265, Japanese Unexamined Patent Publication No. 2005-314680, and the like can be used. However, a metallocene compound having a different structure from those of the metallocene compounds described in the above-described patent documents may also be used. The above-described compounds may be individually injected into a polymerization atmosphere or be brought into contact with each other in advance and then injected into a polymerization atmosphere. Furthermore, for example, the compounds may be carried by the fine particle-shaped inorganic oxide carrier described in Japanese Unexamined Patent Publication No. 2005-314680 or the like.

Meanwhile, preferably, when the ethylene/α-olefin copolymer is manufactured without substantially using (II-2) the compound, it is possible to obtain an ethylene/α-olefin copolymer having excellent electric characteristics.

The polymerization of the ethylene/α-olefin copolymer can be carried out using any one of a well-known gas-phase polymerization method of the related art and a liquid-phase polymerization method such as a slurry polymerization method or a solution polymerization method. The polymerization is preferably carried out using the liquid-phase polymerization method such as the solution polymerization method. In a case in which the ethylene/α-olefin copolymer is manufactured by carrying out the copolymerization of ethylene and an α-olefin having 3 to 20 carbon atoms using the metallocene compound, (I) the metallocene compound is used in an amount in a range of, generally, $10^{-9}$ mole to $10^{-1}$ mole, and preferably $10^{-8}$ mole to $10^{-2}$ mole per a reaction volume of one liter.

The compound (II-1) is used in an amount in which the molar ratio [(II-1)/M] of the compound (II-1) to all transition metal atoms (M) in the compound (I) is generally in a range of 1 to 10000, and preferably in a range of 10 to 5000. The compound (II-2) is used in an amount in which the molar ratio [(II-2)/M] of the compound (II-2) to all the transition metal atoms (M) in the compound (I) is generally in a range of 0.5 to 50, and preferably in a range of 1 to 20. The compound (II-3) is used in an amount in a range of, generally, 0 millimoles to 5 millimoles, and preferably approximately 0 millimoles to 2 millimoles per a polymerization volume of one liter.

In the solution polymerization method, when ethylene and an α-olefin having 3 to 20 carbon atoms are copolymerized in the presence of the above-described metallocene compound, it is possible to efficiently manufacture an ethylene/α-olefin copolymer having a large content of a comonomer, a narrow composition distribution, and a narrow molecular weight distribution. Here, the preliminary molar ratio of ethylene to the α-olefin having 3 to 20 carbon atoms is generally in a range of 10:90 to 99.9:0.1, preferably in a range of 30:70 to 99.9:0.1, and more preferably in a range of 50:50 to 99.9:0.1 (ethylene:α-olefin).

The "solution polymerization method" is a collective term for all methods in which polymerization is carried out in a state in which a polymer is dissolved in an inert hydrocarbon solvent described below. In the solution polymerization method, the polymerization temperature is generally in a range of 0° C. to 200° C., preferably in a range of 20° C. to 190° C., and more preferably in a range of 40° C. to 180° C. In a case in which the polymerization temperature fails to satisfy 0° C., the solution polymerization method is not practical in terms of productivity since the polymerization activity is extremely degraded, and the removal of polymerization heat becomes difficult. In addition, when the polarization temperature exceeds 200° C., the solution polymerization method is not practical in terms of productivity since the polymerization activity is extremely degraded.

The polymerization pressure is generally in a range of normal pressure to 10 MPa (gauge pressure), and preferably in a range of normal pressure to 8 MPa (gauge pressure). Copolymerization can be carried out in all of a batch method, a semi-continuous method, and a continuous method. The reaction time (the average retention time in a case in which a copolymer reaction is carried out using a continuous method) varies depending on the conditions such as the catalyst concentration and the polymerization temperature, and can be appropriately selected, but is generally in a range of one minute to three hours, and preferably in a range of ten minutes to 2.5 hours. Furthermore, it is also possible to carry out the polymerization in two or more steps with different reaction conditions. The molecular weight of the obtained ethylene/α-olefin copolymer can be adjusted by changing the concentration of hydrogen or the polymerization temperature in the polymerization system. Furthermore, the molecular weight of the ethylene/α-olefin copolymer can also be adjusted using the amount of the compound (II) being used. In a case in which hydrogen is added, the amount of hydrogen is appropriately in a range of approximately 0.001 NL to 5000 NL per kilogram of the ethylene/α-olefin copolymer being generated. In addition, a vinyl group and a vinylidene group present at the ends of a molecule in the obtained ethylene/α-olefin copolymer can be adjusted by increasing the polymerization temperature and extremely decreasing the amount of hydrogen being added.

A solvent used in the solution polymerization method is generally an inert hydrocarbon solvent, and is preferably a saturated hydrocarbon having a boiling point in a range of 50° C. to 200° C. at normal pressure. Specific examples thereof include aliphatic hydrocarbon such as pentane, hexane, heptane, octane, decane, dodecane, and kerosene; and alicyclic hydrocarbon such as cyclopentane, cyclohexane, and methylcyclopentane. Meanwhile, aromatic hydrocarbons such as benzene, toluene, and xylene and halogenated hydrocarbon such as ethylene chloride, chlorobenzene, and dichlorobenzene also belong to the scope of the "inert hydrocarbon solvent", and the use thereof is not limited.

As described above, in the solution polymerization method, not only the organic aluminumoxy compound dissolved in the aromatic hydrocarbon, which was frequently used in the related art, but also modified methyl aluminoxane dissolved in the aliphatic hydrocarbon or the alicyclic hydrocarbon such as MMAO can be used. As a result, when the aliphatic hydrocarbon or the alicyclic hydrocarbon is employed as the solvent for the solution polymerization, it becomes possible to almost completely eliminate the possibility of the aromatic hydrocarbon being interfused into the polymerization system or the ethylene/α-olefin copolymer being generated. That is, the solution polymerization method also has characteristics in that the environmental load can be reduced and the influence on human health can be minimized. Meanwhile, to suppress the variation in properties, it is preferable to melt the ethylene/α-olefin copolymer obtained through the polymerization reaction and other components added as desired using an arbitrary method, and to knead and granulate the ethylene/α-olefin copolymer and other components.

The melt flow rate (MFR) of polyvinyl butyral used for the second encapsulating sheet is preferably in a range of 0.05 g/10 minutes to 2 g/10 minutes, and more preferably in a range of 0.1 g/10 minutes to 1 g/10 minutes. MFR may be obtained by a resin to which a plasticizer is added.

In the invention, MFR of polyvinyl butyral is obtained by measuring the amount of a resin eluted for ten minutes under conditions of a temperature of 120° C. and a load of 10 kg according to DIN 53735.

The ethylene/polar monomer copolymer used for the first and second encapsulating sheets is a random copolymer of ethylene and a polar monomer. Examples of the polar monomer include one or more of unsaturated carboxylic acids such as acrylic acid, methacrylic acid, fumaric acid, itaconic acid, monomethyl maleate, monoethyl maleate, maleic anhydride, and itaconic acid anhydride; unsaturated carboxylic acid esters such as methyl acrylate, ethyl acrylate, isopropyl acrylate, isobutyl acrylate, n-butyl acrylate, isooctyl acrylate, methyl methacrylate, ethyl methacrylate, isobutyl methacrylate, and dimethyl maleate; unsaturated glycidyl carboxylic acid esters such as glycidyl acrylate ester and glycidyl methacrylate ester; unsaturated glycidyl carboxylic acid ethers such as glycidyl acrylate ether and glycidyl methacrylate ether; and vinyl esters such as vinyl acetate and vinyl propionate.

Specific examples of the ethylene/polar monomer copolymer used for the first and second encapsulating sheets include ethylene/unsaturated carboxylic acid copolymers such as ethylene/methacrylic acid copolymers; ethylene/unsaturated carboxylic anhydride copolymers such as ethylene/maleic anhydride copolymers and ethylene/itaconic acid anhydride copolymers; ethylene/unsaturated carboxylic acid ester copolymers such as ethylene/methyl acrylate copolymers, ethylene/ethyl acrylate copolymers, ethylene/methyl methacrylate copolymers, ethylene/isobutyl acrylate copolymers, and ethylene/n-butyl acrylate copolymers; ethylene/unsaturated carboxylic acid ester/unsaturated carboxylic acid copolymers such as ethylene/isobutyl acrylate-methacrylic acid copolymers and ethylene/n-butyl acrylate-methacrylic acid copolymers; ethylene/unsaturated glycidyl ester copolymers such as ethylene/glycidyl acrylate ester copolymers; ethylene/unsaturated glycidyl ether copolymers such as ethylene/glycidyl acrylate ether copolymers; ethylene/unsaturated glycidyl ether/unsaturated carboxylic acid ester copolymers such as ethylene/glycidyl acrylate ester/methyl acrylate copolymers; ethylene/unsaturated glycidyl ether/unsaturated carboxylic acid ester copolymers such as ethylene/glycidyl acrylate ether/methyl acrylate copolymers; ethylene/vinyl ester copolymers such as ethylene/vinyl acetate copolymers; and the like, and the above-described ethylene/polar monomer copolymers can be used as a mixture of one or more ethylene/polar monomer copolymers. Among the above-described ethylene/polar monomer copolymers, ethylene/unsaturated glycidyl ester copolymers, ethylene/unsaturated glycidyl ether copolymers, ethylene/unsaturated glycidyl ester/unsaturated carboxylic acid ester copolymers, ethylene/unsaturated glycidyl ether/unsaturated carboxylic acid ester copolymers, ethylene/vinyl ester copolymers, and the like are preferred.

The content of the polar monomer in the ethylene/polar monomer copolymer used for the first and second encapsulating sheets is preferably in a range of 15 weight % to 50 weight %, more preferably in a range of 15 weight % to 40 weight %, and more preferably in a range of 20 weight % to 40 weight %. When the content of the polar monomer is within the above-described range, the balances between the acetone and t-butanol-absorbing ratios and the shore A hardness of the first and second encapsulating sheets improve, and extrusion-molding is possible.

Among the above-described ethylene/polar monomer copolymers, the ethylene/polar monomer copolymer used for the first and second encapsulating sheets is preferably the ethylene/vinyl acetate copolymers, and the content of vinyl acetate in the ethylene/vinyl acetate copolymer is preferably in a range of 15 weight % to 47 weight %, and more preferably in a range of 20 weight % to 40 weight %. When the content of vinyl acetate in the ethylene/vinyl acetate copolymer is within the above-described range, the balances between the acetone and t-butanol-absorbing ratios and the shore A hardness of the first and second encapsulating sheets improve, and extrusion-molding is possible.

The melt flow rate (MFR) of the ethylene/vinyl acetate copolymer used for the first and second encapsulating sheets is preferably in a range of 5 g/10 minutes to 50 g/10 minutes, more preferably in a range of 5 g/10 minutes to 30 g/10 minutes, and more preferably in a range of 5 g/10 minutes to 25 g/10 minutes. When MFR of the ethylene/polar monomer copolymer is within the above-described range, the extrusion moldability is excellent. MFR of the ethylene/polar monomer copolymer can be adjusted by adjusting the polymerization temperature and the polymerization pressure during the polymerization reaction, the molar ratio between the monomer concentration and the hydrogen concentration in the polar monomer in the polymerization system, and the like.

In the invention, MFR of the ethylene/vinyl acetate copolymer is based on ASTM D1238 and is measured under conditions of a temperature of 190° C. and a load of 2.16 kg.

In a case in which the ethylene/vinyl acetate copolymer is used for the second encapsulating sheet, it is particularly preferable to set the content of vinyl acetate in the ethylene/vinyl acetate copolymer in a range of 15 weight % to 47 weight %, and preferably in a range of 20 weight % to 40 weight %, and to set MFR in a range of 5 g/10 minutes to 50 g/10 minutes, and preferably in a range of 5 g/10 minutes to 30 g/10 minutes. Then, it is possible to set the acetone-absorbing ratio ($A_2$) and the t-butanol-absorbing ratio ($B_2$) in preferable ranges.

The ethylene/polar monomer copolymer used for the first and second encapsulating sheets is a copolymer containing the above-described monomer unit, and the copolymer can be manufactured by, for example, copolymerizing the monomer unit in the presence of a radical-generating agent at a pressure in a range of 500 atmospheric pressure to 4000 atmospheric pressure and a temperature in a range of 100° C. to 300° C. in the presence or absence of a solvent or a chain transfer agent. In addition, a mixture composed of a polyethylene, an unsaturated compound having a glycidyl group, and a radical-generating agent, and the like can also be manufactured through molten graft polymerization using an extruder or the like.

The resin composition configuring the first and second encapsulating sheets can also contain a silane coupling agent. In the first and second encapsulating sheets, the content of the silane coupling agent is preferably in a range of 0.1 parts by weight to 2 parts by weight, more preferably in a range of 0.1 parts by weight to 1.8 parts by weight, and still more preferably in a range of 0.1 parts by weight to 1.5 parts by weight with respect to 100 parts by weight of the crosslinkable resin. When the content of the silane coupling agent is set in the above-described range, it is possible to more reliably suppress the generation of air bubbles while improving the adhesiveness.

Examples of the silane coupling agent that can be used include vinyltriethoxysilane, vinyl trimethoxysilane, vinyl tris(β-methoxyethoxy)silane, 2-(3,4-epoxy cyclohexyl)ethyl trimethoxysilane, 3-glycidoxy propyl methyl dimethoxysilane, 3-glycidoxy propyl trimethoxysilane, 3-glycidoxy propyl methyl diethoxysilane, 3-glycidoxy propyl triethoxysilane, p-styryl trimethoxysilane, 3-aminopropyl triethoxysilane, 3-aminopropyl trimethoxysilane, N-2-(aminoethyl)-3-aminopropyl methyl dimethoxysilane, N-2-(aminoethyl)-3-aminopropyl trimethoxysilane, 3-triethoxysilyl-N-(1,3-dimethyl-butylidene)propylamine, N-phenyl-3-aminopropyl trimethoxysilane, 3-ureidopropyl triethoxysilane, 3-isocyanate propyl triethoxysilane, 3-methacryloxypropyl trimethoxysilane, 3-methacryloxypropyl methyl dimethoxysilane, 3-methacryloxypropyl methyl dimethoxysilane, 3-methacryloxypropyl triethoxysilane, 3-methacryloxypropyl methyl diethoxysilane, 3-acryloxypropyl trimethoxysilane, and the like. Preferable examples thereof include 3-glycidoxy propyl trimethoxysilane, 3-glycidoxypropyl triethoxysilane, 3-aminopropyl triethoxysilane, 3-methacryloxypropyl trimethoxysilane, 3-methacryloxypropyl triethoxysilane, 3-acryloxypropyl trimethoxysilane, and vinyltriethoxysilane due to their favorable adhesiveness.

The resin composition configuring the first and second encapsulating sheets can also contain an organic peroxide. The organic peroxide preferably used in the sheet for encapsulating a solar battery of the invention preferably has a one-minute half-life temperature in a range of 100° C. to 170° C. in consideration of the balance between the productivity during extrusion sheet molding and the crosslinking rate during the lamination molding of the solar battery module. When the one-minute half-life temperature of the organic peroxide is 100° C. or higher, sheet molding becomes simple, and it is possible to provide a favorable appearance to the sheet. In addition, it is possible to prevent the dielectric breakdown voltage from decreasing, to prevent the moisture permeability from degrading, and to improve the adhesiveness. When the one-minute half-life temperature of the organic peroxide is equal to or lower than 170° C., it is possible to suppress a decrease in the crosslinking rate during the lamination molding of the solar battery module, and therefore it is possible to prevent the degradation of the productivity of the solar battery module. In addition, it is also possible to prevent the heat resistance and adhesiveness of the sheet for encapsulating a solar battery from degrading.

Specific preferable examples of the organic peroxide having a one-minute half-life temperature in a range of 100° C. to 170° C. include dilauroyl peroxide, 1,1,3,3-tetramethylbutyl peroxy-2-ethylhexanoate, dibenzoyl peroxide, t-amylperoxy-2-ethylhexanoate, t-butylperoxy-2-ethylhexanotae, t-butylperoxy isobutyrate, t-butylperoxy maleate, 1,1-di(t-amylperoxy)-3,3,5-trimethylcyclohexane, 1,1-di(t-amylpeoxy)cyclohexane, t-amylperoxy isononanoate, t-amylperoxy normaloctoate, 1,1-di(t-butylperoxy)-3,3,5-trimethylcyclohexane, 1,1-di(t-butylperoxy)cyclohexane, t-butylperoxy isopropyl carbonate, t-butylperoxy-2-ethylhexylcarbonate, 2,5-dimethyl-2,5-di(benzoylperoxy) hexane, t-amyl-peroxybenzoate, t-butylperoxy acetate, t-butylperoxy isononanoate, 2,2-di(t-butylperoxy)butane, t-butylperoxy benzoate, and the like. Preferable examples thereof include dilauroyl peroxide, t-butylperoxy isopropyl carbonate, t-butyl proxy acetate, t-butylperoxy isononanoate, t-butylperoxy-2-ethylhexyl carbonate, t-butylperoxy benzoate, and the like.

Since the first and second encapsulating sheets have excellent crosslinking characteristics when containing the organic peroxide, a two-phase adhering step in a vacuum laminator and a crosslinking furnace is not required, and the sheet for encapsulating a solar battery can be completed at a high temperature within a short period of time.

In the first and second encapsulating sheets, the content of the organic peroxide is preferably in a range of 0.1 parts by weight to 1.2 parts by weight, more preferably in a range of 0.2 parts by weight to 1.0 part by weight, and still more preferably in a range of 0.2 parts by weight to 0.8 parts by weight with respect to 100 parts by weight of the crosslinkable resin. When the content of the organic peroxide is equal to or more than 0.1 parts by weight, the degradation of the crosslinking characteristics of the sheet for encapsulating a solar battery is suppressed, and it is possible to suppress the degradation of the heat resistance and the adhesiveness by improving the graft reaction of the silane coupling agent into the main chain of the ethylene/based copolymer. In addition, when the content of the organic peroxide is equal to or less than 1.2 parts by weight, the generation amount of the decomposition product and the like of acetone, t-butanol and other organic peroxides is further decreased, and it is possible to reliably prevent the generation of air bubbles.

The resin composition configuring the first and second encapsulating sheets preferably contains at least one additive, more preferably contains at least two additives, and still more preferably contains all three additives selected from a group consisting of an ultraviolet absorber, a light stabilizer, and a heat-resistant stabilizer.

The content of the three additives is preferably in a range of 0.005 parts by weight to 5 parts by weight with respect to 100 parts by weight of the crosslinkable resin in the first and second encapsulating sheets. When the content of the additives is set in the above-described range, an effect that improves the resistance against a constant temperature and a constant humidity, the resistance against the heat cycle, weather resistance stability and heat resistance stability is sufficiently ensured, and it is possible to prevent the transparency or adhesiveness of the sheet from degrading.

Specific examples of the ultraviolet absorber that can be used include benzophenone-based ultraviolet absorbers such as 2-hydroxy-4-normal-octyloxylbenzophenone, 2-hydroxy-4-methoxybenzophenone, 2,2-dihydroxy-4-methoxybenzophenone, 2-hydroxy-4-methoxy-4-carboxybenzophenone, and 2-hydroxy-4-n-octoxybenzophenone; benzotriazole-based ultraviolet absorbers such as 2-(2-hydroxy-3,5-di-t-butylphenyl)benzotriazole and 2-(2-hydroxy-5-methylpheyl)benzotriazole; salicyclic acid ester-based ultraviolet absorbers such as phenyl salicylate and p-octyl phenyl salicylate.

Examples of the light stabilizer that can be preferably used include hindered amine-based light stabilizers such as bis(2,2,6,6-tetramethyl-4-piperidyl)sebacate, poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}]; hindered pyperidine-based compounds, and the like.

Specific examples of the heat-resistant stabilizer include phosphite-based heat-resistant stabilizer such as tris(2,4-di-tert-butylphenyl)phosphite, bis[2,4-bis(1,1-dimethylethyl)-6-methylphenyl]ethylester photsphite, tetrakis(2,4-di-tert-butylphenyl)[1,1-viphenyl]-4,4'-diylbisphosphonite and bis(2,4-di-tert-butylphenyl)pentaerythritol diphosphite; lactone-based heat-resistant stabilizers such as a reaction product of 3-hydroxy-5,7-di-tert-butyl-furan-2-one and o-xylene; hindered phenol-based heat-resistant stabilizers such as 3,3',",5,5',5"-hexa-tert-butyl-a,a',a"-(methylene-2,4,6-toryl)tri-p-cresole, 1,3,5-trimethyl-2,4,6-tris(3,5-di-tert-butyl-4-hydroxyphenyl)benzylbenzene, pentaerythritol tetrakis[3-(3,5-di-tert-butyl-4-hydroxyphenyl)propionate], octadecyl-3-(3,5-di-tert-butyl-4-hydroxyphenyl)propionate, and thiodiethylene bis[3-(3,5-di-tert-butyl-4-hydroxyphenyl)propionate]; sulfur-based heat-resistant stabilizers; amine-based heat-resistant stabilizers; and the like. In addition, it is possible to use only one of the above-described heat-resistant stabilizers or a combination of two or more heat-resistant stabilizers. Among the above-described heat-resistant stabilizers, the phosphite-based heat-resistant stabilizers and the hindered phenol-based heat-resistant stabilizers are preferred.

The first and second encapsulating sheets may be made of a resin composition containing a crosslinking aid. The content of the crosslinking aid in the first and second encapsulating sheets is preferably in a range of 0.05 parts by weight to 5 parts by weight with respect to 100 parts by weight of the crosslinkable resin since the first and second encapsulating sheets are capable of having an appropriate crosslinking structure, and of improving the heat resistance, the mechanical characteristics, and the adhesiveness.

A compound having two or more double bonds in the molecule can be used as the crosslinking aid, and specific examples thereof include monoacrylates such as t-butyl acrylate, lauryl acrylate, cetyl acrylate, stearyl acrylate, 2-methoxyethyl acrylate, ethylcarbitol acrylate and methoxytripropylene glycol acrylate; monomethacrylates such as t-butyl methacrylate, lauryl methacrylate, cetyl methacrylate, stearyl methacrylate, methoxyethylene glycol methacrylate and methoxypolyethylene glycol methacrylate; diacrylates such as 1,4-butanediol diacrylate, 1,6-hexanediol diacrylate, 1,9-nonanedioldiacrylate, neopentyl glycol diacrylate, diethylene glycol diacrylate, tetraethylene glycol diacrylate, polyethylene glycol diacrylate, tripropylene glycol diacrylate and polypropylene glycol diacrylate; dimethacrylates such as 1,3-butanediol dimethacrylate, 1,6-hexanediol dimethacrylate, 1,9-nonanediol dimethacrylate, neopentyl glycol dimethacrylate, ethylene glycol dimethacrylate, diethylene glycol dimethacrylate, triethylene glycol dimethacrylate and polyethylene glycol dimethacrylate; triacrylates such as trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; divinyl aromatic compounds such as divinyl benzene and di-1-propenyl benzene; cyanurates such as triallyl cyanurate and triallyl isocyanurate; diallyl compounds such as diallyl phthalate; triallyls compound; oximes such as p-quinone dioxime and p,p'-dibenzoyl quinone dioxime; maleimides such as phenyl maleimide. Among the above-described crosslinking aids, diacrylate, dimethacrylate, divinyl aromatic compounds, triacrylates such as trimethylol propane triacrylate, tetramethylol methane triacrylate and pentaerythritol triacrylate; trimethacrylates such as trimethylol propane trimethacrylate and trimethylol ethane trimethacrylate; tetraacrylates such as pentaerythritol tetraacrylate and tetramethylol methane tetraacrylate; cyanurates such as trially cyanurate and triallyl isocyanurate; diallyl compounds such as diallyl phthalate; triallyl compounds; oximes such as p-quinone dioxime and p,p'-dibenzoyl quinonedioxime; maleimides such as phenyl maleimide. Furthermore, among the above-described crosslinking aids, triallyl isocyanurate is particularly preferred since the generation of air bubbles in the sheet for encapsulating a solar battery or the balance between crosslinking characteristics is excellent.

The resin composition configuring the first and second encapsulating sheets can appropriately contain a variety of components other than the components described above in detail within the scope of the purpose of the invention. Examples thereof include a variety of polyolefins other than the ethylene-based copolymer, styrene-based or ethylene-based block copolymers, propylene-based polymers, and the like. In the first and second encapsulating sheets, the content of the above-described components may be in a range of 0.0001 parts by weight to 50 parts by weight, and preferably in a range of 0.001 parts by weight to 40 parts by weight with respect to 100 parts by weight of the crosslinkable resin. In addition, the resin composition can appropriately contain one or more additives selected from a variety of resins other than polyolefins and/or a variety of rubbers, a plasticizer, a filler, a pigment, a dye, an antistatic agent, an antimicrobial agent, an antifungal agent, a flame retardant, a dispersant, and the like.

The thicknesses of the first and second encapsulating sheets are preferably in a range of 0.01 mm to 2 mm, more preferably in a range of 0.05 mm to 1.5 mm, still more preferably in a range of 0.1 mm to 1.2 mm, further preferably in a range of 0.2 mm to 1 mm, and particularly preferably in a range of 0.2 mm to 0.8 mm, and, among the above-described ranges, the thickness is preferably in a range of 0.25 mm to 0.6 mm. When the thickness is within the above-described range, it is possible to suppress the breakage of a light-incident surface protective member, a solar battery element, a thin film electrode, and the like during the lamination step and to ensure a sufficient light transmittance, thereby obtaining a great light power generation amount. Furthermore, the lamination molding of the solar battery module at a low temperature is possible, which is preferable.

An ordinarily-used method can be used as a method for manufacturing the first and second encapsulating sheets, but the first and second encapsulating sheets are preferably manufactured through melt blend using a calendar roll, a kneader, a Banbury mixer, an extruder or the like. Particularly, the first and second encapsulating sheets are preferably manufactured using an extruder capable of continuous production.

There is no particular limitation regarding a method for molding the first and second encapsulating sheets, and it is possible to employ a variety of well-known molding methods (cast molding, extrusion sheet molding, inflation molding, injection molding, compression molding, and the like). Particularly, a method is more preferred in which a composition, in which the crosslinkable resin and a variety of additives are blended, obtained by manually blending in a bag such as a plastic bag or blending using a stirring and mixing machine such as a Henschel mixer, a tumbler or a super mixer, the ethylene-based copolymer, the silane coupling agent, the organic peroxide, the ultraviolet absorber, the light stabilizer, the heat-resistant stabilizer, if necessary, and other additives is injected into an extrusion sheet molding hopper, and extrusion sheet molding is carried out while melting and stirring the mixture in an extruder, thereby obtaining a sheet for encapsulating a solar battery since it is possible to improve the adhesiveness and to prevent the deterioration of the light stabilizer, thereby preventing degradation of the long-term reliability such as weather resistance or heat resistance.

The extrusion temperature is preferably in a range of 100° C. to 130° C. When the extrusion temperature is set in the above-described range, it is possible to obtain a sheet for encapsulating a solar battery having a favorable appearance and excellent adhesiveness while improving the productivity of the sheet.

In addition, in a case in which MFR of the ethylene/α-olefin copolymer is, for example, equal to or less than 10 g/10 minutes, it is also possible to obtain the first and second encapsulating sheets by carrying out calendar molding using a calendar molder in which a molten resin is rolled using a heated metal roll (calendar roll) so as to produce a sheet or film having a desired thickness while melting and kneading the ethylene/α-olefin copolymer, if necessary, the silica coupling agent, the organic peroxide, the ultraviolet absorber, the light stabilizer, the heat-resistant stabilizer, and other additives. A variety of well-known calendar molders can be used as the calendar molder, and it is possible to use a mixing roll, a three roll calendar, or a four roll calendar. Particularly, 1-type, S-type, inverse L-type, Z-type, and inclined Z-type calendar rolls can be used as the four roll calendar. In addition, it is preferable to heat the ethylene-based resin composition to an appropriate temperature before being put into the calendar roll, and it is also one of preferable embodiments to install, for example, a Banbury mixer, a kneader, an extruder, or the like. Regarding the temperature range for the calendar molding, it is preferable to set the roll temperature, generally, in a range of 40° C. to 100° C.

An example of a method for manufacturing the first and second encapsulating sheets is a method in which a crosslinkable resin is mixed together with additives including the organic peroxide using a Henschel mixer or a tumbler mixer, and is supplied to an extruder, thereby molding the mixture into a sheet shape. It is also possible to separately supply the crosslinkable resin and the additives to an extrusion molder, melt and mix the components in the molder. Furthermore, it is also possible to melt and knead the crosslinkable resin once so as to produce a mixed pellet, and supply the pellet to the extruder again, thereby molding the pellet into a sheet shape.

In addition, an embossing process may be carried out on the surfaces of the first and second encapsulating sheets. The embossing process may be carried out on either or both surfaces of the first and second encapsulating sheets. When the sheet surfaces of the first and second encapsulating sheets are decorated through the embossing process, it is possible to prevent the blocking between the encapsulating sheets or between the encapsulating sheet and other sheets. Furthermore, since embosses decreases the storage elastic modulus of the sheet for encapsulating a solar battery, the embosses serve as cushions for the solar battery elements and the like during the lamination of the sheet for encapsulating a solar battery and the solar battery elements, and the breakage of the solar battery element can be prevented.

The porosity P (%), which is expressed by the percentage ratio $(V_H/V_A) \times 100$ of the total volume $V_H$ per unit area of concave portions in the sheet for encapsulating a solar battery to the apparent volume $V_A$ of the sheet for encapsulating a solar battery is preferably in a range of 10% to 50%, more preferably in a range of 10% to 40%, and still more preferably in a range of 15% to 40%. Meanwhile, the apparent volume $V_A$ of the sheet for encapsulating a solar battery can be obtained by multiplying the unit area by the maximum thickness of the sheet for encapsulating a solar battery.

When the porosity P is equal to or more than 10%, it is possible to sufficiently decrease the elastic modulus of the sheet for encapsulating a solar battery, and therefore sufficient cushion properties can be obtained. Therefore, during the lamination process, even when a great pressure is locally applied to, for example, a silicon cell or the like, it is possible to prevent the silicon cell from cracking. In addition, when the porosity P is equal to or less than 80%, air can be favorably exhausted during the pressurization in the lamination process, and therefore it is possible to prevent the deterioration of the appearance of the solar battery module and the corrosion of the electrode, and to obtain a sufficient adhering strength by increasing the adhering area between the sheet for encapsulating a solar battery and an adherends to be adhered.

The porosity P can be obtained through the following calculation. The apparent volume $V_A$ (mm$^3$) of the embossed sheet for encapsulating a solar battery is computed from the product of the maximum thickness $t_{max}$(mm) and unit area (for example, 1 m$^2$=1000×1000=10$^6$ mm$^2$) of the sheet for encapsulating a solar battery as described in the following formula (3).

$$V_A(\text{mm}^3) = t_{max}(\text{mm}) \times 10^6 (\text{mm}^2) \qquad (3)$$

Meanwhile, the actual volume $V_0$ (mm$^3$) of the sheet for encapsulating a solar battery per unit area is computed by applying the specific weight p (g/mm$^3$) of a resin configuring the sheet for encapsulating a solar battery and the actual weight W (g) of the sheet for encapsulating a solar battery per unit area (1 m$^2$) to the following formula (4).

$$V_0(\text{mm}^3) = W/\rho \tag{4}$$

The total volume $V_H$ (mm$^3$) per unit area of the concave portions in the sheet for encapsulating a solar battery is computed by subtracting the "actual volume $V_0$" from the "apparent volume $V_A$ of the sheet for encapsulating a solar battery" as described in the following formula (5).

$$V_H(\text{mm}^3) = V_A - V_0 = V_A - (W/\rho) \tag{5}$$

Therefore, the porosity (%) can be obtained in the following manner.

$$\begin{aligned}\text{Porosity } P(\%) &= (V_H/V_A) \times 100 \\ &= ((V_A - (W/\rho))/V_A) \times 100 \\ &= (1 - W/(\rho \cdot V_A)) \times 100 \\ &= (1 - W/(\rho \cdot t_{max} \cdot 10^6)) \times 100\end{aligned}$$

The porosity (%) can be obtained using the above-described formulae, but can also be obtained by photographing the cross-section or embossed surface of an actual sheet for encapsulating a solar battery and then processing the image or the like.

The first and second encapsulating sheets can also be used in a leaflet form in which the sheets have been cut in accordance with the size of the solar battery module respectively or in a roll form in which the sheets can be cut in accordance with the size immediately before the solar battery module is produced.

The number of the first or second encapsulating sheets configuring the solar battery encapsulating sheet of the invention may be one or multiple, but the number of the first or second encapsulating sheets is preferably one since the structure can be simplified so as to decrease the cost, the interface reflection between layers is extremely decreased, and light is effectively utilized. The first and second encapsulating sheets may be configured using only the first and second encapsulating sheets, or may have layers other than the first and second encapsulating sheets (hereinafter, also referred to as "other layers"). The other layers can be classified based on the purposes into, for example, a hard coat layer for protecting the light-incident surface or the back surface, an adhering layer, an antireflection layer, a gas barrier layer, an anti-contamination layer, and the like. The other layers can be classified based on the material into, for example, an ultraviolet-curable resin layer, a thermosetting resin layer, a polyolefin resin layer, a carboxylic acid-modified polyolefin resin layer, a fluorine-containing resin layer, a cyclic olefin (co)polymer layer, an inorganic compound layer, and the like.

The sheet set for encapsulating a solar battery including the first encapsulating sheet and the second encapsulating sheet manufactured in the above-described manner are disposed between the light-incident surface protective member and the back surface protective member, and are used to encapsulate the solar battery elements. The first encapsulating sheet and the second encapsulating sheet can be combined in various manners in consideration of the usage of the module.

For example, the sheet set for encapsulating a solar battery of the invention may be an encapsulating sheet set including a pair of the light-incident surface encapsulating sheet and the back surface encapsulating sheet. In the encapsulating sheet set, the light-incident surface encapsulating sheet and the back surface encapsulating sheet may have the same configuration, and at least one of the light-incident surface encapsulating sheet and the back surface encapsulating sheet may be composed of a plurality of sheets. From the viewpoint of suppressing the occurrence of PID, it is preferable to include the first encapsulating sheet at least in the light-incident surface encapsulating sheet, and it is more preferable to include the second encapsulating sheet in the back surface encapsulating sheet from the viewpoint of suppressing the generation of air bubbles.

In addition, since the polar group included in the second encapsulating sheet is excellent in terms of adhesiveness, it is more preferable to dispose the second encapsulating sheet to be in contact with the light-incident surface protective member (particularly, a glass plate). When the second encapsulating sheet is disposed in contact with the solar battery elements or the back surface protective member, it is possible to obtain a solar battery module in which the adhesiveness among the respective members is superior.

The set for encapsulating of the invention includes, for example, the following examples 1 to 4.

Example 1

This example is a sheet set made up of a pair of one first encapsulating sheet as a light-incident surface encapsulating sheet and one second encapsulating sheet as a back surface encapsulating sheet. The first encapsulating sheet is disposed between the light-incident surface protective member and the solar battery elements, and the second encapsulating sheet is disposed between the solar battery elements and the back surface protective member. The first encapsulating sheet is preferably in contact with the light-incident surface protective member and the solar battery elements respectively, and the second encapsulating sheet is preferably in contact with the back surface protective member and the solar battery elements. The thicknesses of the first encapsulating sheet and the second encapsulating sheet are preferably in a range of 0.01 mm to 2 mm, more preferably in a range of 0.05 mm to 1.5 mm, still more preferably in a range of 0.1 mm to 1.2 mm, further more preferably in a range of 0.2 mm to 1 mm, and particularly preferably in a range of 0.2 mm to 0.8 mm respectively. Among the above-described ranges, the thicknesses are most preferably in a range of 0.25 mm to 0.6 mm.

Example 2

This example is a sheet set made up of three sheets, that is, the first and second encapsulating sheets having a relatively small thickness as the light-incident surface encapsulating sheets and the second encapsulating sheet having a relatively large thickness as the back surface encapsulating sheet. In this example, the first and second encapsulating sheets having a relatively small thickness are to be laminated and disposed between the light-incident surface protective member and the solar battery elements. In this case, the first and second encapsulating sheets having a relatively small thickness are preferably disposed in contact with each other. In addition, when a preformed laminate of the first and second encapsulating sheets having a relatively small thickness is used, it is possible to shorten the manufacturing time of the module, which is preferable. The second encapsulating sheet having a relatively large thickness is disposed between the solar battery elements and the back surface protective member. The thickness of the second encapsulating sheet having a relatively large thickness is preferably in a range of 0.01 mm to 2 mm, more preferably in a range of 0.05 mm to 1.5 mm, still more preferably in a range of 0.1 mm to 1.2 mm, further more preferably in a range of 0.2 mm to 1 mm, and particularly preferably in a range of 0.2 mm to 0.8 mm. Among the above-described ranges, the thickness is most preferably in a range of 0.25 mm to 0.6 mm. The thickness of the laminate of the first and second encapsulating sheets having a relatively small thickness is preferably in a range of 0.01 mm to 2 mm, more preferably in a range of 0.05 mm to 1.5 mm, still more preferably in a range of 0.1 mm to 1.2 mm, further more preferably in a range of 0.15 mm to 1 mm, and particularly preferably in a range of 0.2 mm to 0.8 mm. Among the above-described ranges, the thickness is most preferably in a range of 0.25 mm to 0.6 mm.

In the sheet set of Example 2, it is possible to dispose the first encapsulating sheet in contact with the light-incident surface protective member and the second encapsulating sheet in contact with the surfaces of the solar battery elements, or to dispose the second encapsulating sheet in contact with the light-incident surface protective member and the first encapsulating sheet in contact with the surfaces of the solar battery elements. In this example, since the second encapsulating sheet is provided on the light-incident surface side of the solar battery elements, it is possible to absorb gas generated on the light-incident surface side in the second encapsulating sheet, and particularly, it is possible to more reliably suppress the generation of air bubbles on the light-incident surface side in a case in which large solar battery elements are used.

Example 3

This example is a sheet set made up of three sheets, that is, the first encapsulating sheet having a relatively large thickness as the light-incident surface encapsulating sheet and the first and second encapsulating sheets having a relatively small thickness as the back surface encapsulating sheet. In this example, the first and second encapsulating sheets having a relatively small thickness are to be laminated and disposed between the solar battery elements and the back surface protective member. The first and second encapsulating sheets having a relatively small thickness are preferably disposed in contact with each other. In addition, when a preformed laminate of the first and second encapsulating sheets having a relatively small thickness is used, it is possible to shorten the manufacturing time of the module, which is preferable. The first encapsulating sheet having a relatively large thickness is disposed between the light-incident surface protective member and the solar battery elements. The thickness of the first encapsulating sheet having a relatively large thickness is preferably in a range of 0.01 mm to 2 mm, more preferably in a range of 0.05 mm to 1.5 mm, still more preferably in a range of 0.1 mm to 1.2 mm, further more preferably in a range of 0.2 mm to 1 mm, and particularly preferably in a range of 0.2 mm to 0.8 mm. Among the above-described ranges, the thickness is most preferably in a range of 0.25 mm to 0.6 mm. The thickness of the laminate of the first and second encapsulating sheets having a relatively small thickness is preferably in a range of 0.01 mm to 2 mm, more preferably in a range of 0.05 mm to 1.5 mm, still more preferably in a range of 0.1 mm to 1.2 mm, further more preferably in a range of 0.15 mm to 1 mm, and particularly preferably in a range of 0.2 mm to 0.8 mm. Among the above-described ranges, the thickness is most preferably in a range of 0.25 mm to 0.5 mm.

In the sheet set of Example 3, it is preferable to dispose the first encapsulating sheet in contact with the back surface protective member and the second encapsulating sheet in contact with the surfaces of the solar battery elements.

Example 4

This example is a sheet set made up of three sheets, that is, one first encapsulating sheet and two second encapsulating sheets. In the sheet set, an arbitrary sheet for encapsulating a solar battery may be combined as the back surface encapsulating sheet, or the sheet set is made up of two sets of the above-described three sheets in which one set serves as the light-incident encapsulating sheet and the other set serves as the back surface encapsulating sheet as long as at least the light-incident surface encapsulating sheet is configured as described above. In this example, the sheet set of the three sheets is to be disposed between the light-incident surface protective member and the solar battery elements so that the second encapsulating sheet, the first encapsulating sheet, and the second encapsulating sheet are laminated in this order. In this case, the three sheets are preferably disposed in contact with one another. In addition, the light-incident surface protective member and the solar battery elements are preferably in contact with the second encapsulating sheet respectively. In addition, when a preformed laminate of the three sheets is used, it is possible to shorten the manufacturing time of the module, which is preferable. When the three sheets are laminated, the thicknesses of the first and second encapsulating sheets is preferably in a range of 0.01 mm to 2 mm, more preferably in a range of 0.05 mm to 1.5 mm, still more preferably in a range of 0.1 mm to 1.2 mm, further more preferably in a range of 0.2 mm to 1 mm, and particularly preferably in a range of 0.2 mm to 0.8 mm. Among the above-described ranges, the thickness is most preferably in a range of 0.25 mm to 0.6 mm. In this example, similar to Example 2, the second encapsulating sheet is provided on the light-incident surface side of the solar battery elements, and therefore, it is possible to absorb gas generated on the light-incident surface side in the second encapsulating sheet, and particularly, it is possible to more reliably suppress the generation of air bubbles on the light-incident surface side in a case in which large solar battery elements are used.

Another aspect of the invention is the solar battery module. FIG. 1 is a cross-sectional view schematically illustrating a first embodiment of the solar battery module of the invention. A solar battery module 10 illustrated in FIG. 1 is formed using the sheet set for encapsulating a solar battery described in Example 1. An encapsulating layer 1 is provided between a light-incident surface protective member 14 and a back surface protective member 15, and solar battery elements 13 are encapsulated in the encapsulating layer 1. The encapsulating layer 1 includes a first encapsulating layer 11 and a second encapsulating layer 12. When the volume resistivity of the first encapsulating layer 11 and the second encapsulating layer 12 is measured on the basis of JIS K6911 at a temperature of 100° C. with an applied voltage of 500 V, the volume resistivity of the first encapsulating layer 11 is greater than the volume resistivity of the second encapsulating layer 12. In addition, the second encapsulating layer 12 includes at least one polar group selected from a carboxyl group, an ester group, a hydroxyl group, an amino group, and an acetal group. In addition, the first encapsulating layer 11 is provided between the light-incident surface protective member 14 and the solar battery elements 13.

Specifically, the volume resistivity of the first encapsulating layer 11 (also referred to as the light-incident surface encapsulating layer 11) and the second encapsulating layer 12 (also referred to as the back surface encapsulating layer 12) can be measured in the following manner. That is, in a case in which a plurality of the solar battery elements 13 is provided as illustrated in the drawing, a test specimen including one solar battery element 13 is cut out using a water jet cutter or the like. Next, the back surface protective member 15 is peeled off. Then, a test specimen having a configuration of the light-incident surface protective member 14/the first encapsulating layer 11/the solar battery element 13/the second encapsulating layer 12 can be obtained.

When one electrode of a resistance measurement device is connected to the solar battery element 13, and the other electrode is connected to the second encapsulating layer 12, the volume resistivity of the second encapsulating layer 12 can be measured. In a case in which the measured value is not stable, the electrode is connected to the solar battery element 13 by short-circuiting the front surface (light-incident surface) and back surface of the solar battery element 13.

When one electrode of a resistance measurement device is connected to the solar battery element 13 in the same manner as described above, and the other electrode is connected to the light-incident surface protective member 14 through conductive rubber having a size matching the electrode size, the volume resistivity of the first encapsulating layer 11 can be measured. In this case, strictly speaking, the total resistance of the light-incident surface protective member 14 and the first encapsulating layer 11 is measured, but the volume resistivity of soda glass, which is generally used for the light-incident surface protective member 14, is on the order of approximately $10^{10}$ Ω·cm, and the volume resistivity of the first encapsulating layer 11 preferably used in the invention is on the order of approximately $10^{13}$ Ω·cm, and therefore the measured value is substantially equal to the resistance of the first encapsulating layer 11.

However, in the measurement for both the first encapsulating layer 11 and the second encapsulating layer 12, the value after 1000 seconds is used in a case in which the measured value is not stable, and the resistance value tends to continuously increase after a voltage is applied.

In addition, when the volume resistance is computed, regarding the film thicknesses of the first encapsulating layer 11 and the second encapsulating layer 12, the first and second encapsulating layers are peeled off from the solar battery elements 13, the thicknesses in a contact type are measured, and the average value obtained from the measurements at five points is used. In a case in which the sheets are not peeled off, the thicknesses may be obtained by measuring the optical film thicknesses of two reflection surfaces in the encapsulating layers using a laser displacement meter, and carrying out the film thickness conversion using the actually measured refractive indexes of the encapsulating layers. In addition, in the case of the first encapsulating layer 11, similarly, it is possible to measure the optical film thicknesses of two reflection surfaces in the encapsulating layers, beyond the light-incident surface protective member 14 such as a glass plate, in the same manner using a laser displacement meter, separately measure the refractive indexes after the encapsulating layers are peeled off, and carry out the film thickness conversion. The respective laser displacement meters being used are not particularly specified as long as the apparatus is capable of measuring the distance between the two reflection surfaces in the encapsulating layers, and, for example, a laser displacement meter LT-9000 manufactured by Keyence Corporation or the like may be used.

In the example of FIG. 1, the first encapsulating layer 11 is formed by disposing the first encapsulating sheet between the light-incident surface protective member 14 and the solar battery elements 13. In addition, the second encapsulating layer 12 is formed by disposing the second encapsulating sheet between the solar battery elements 13 and the back surface protective member 15.

Figure 2:
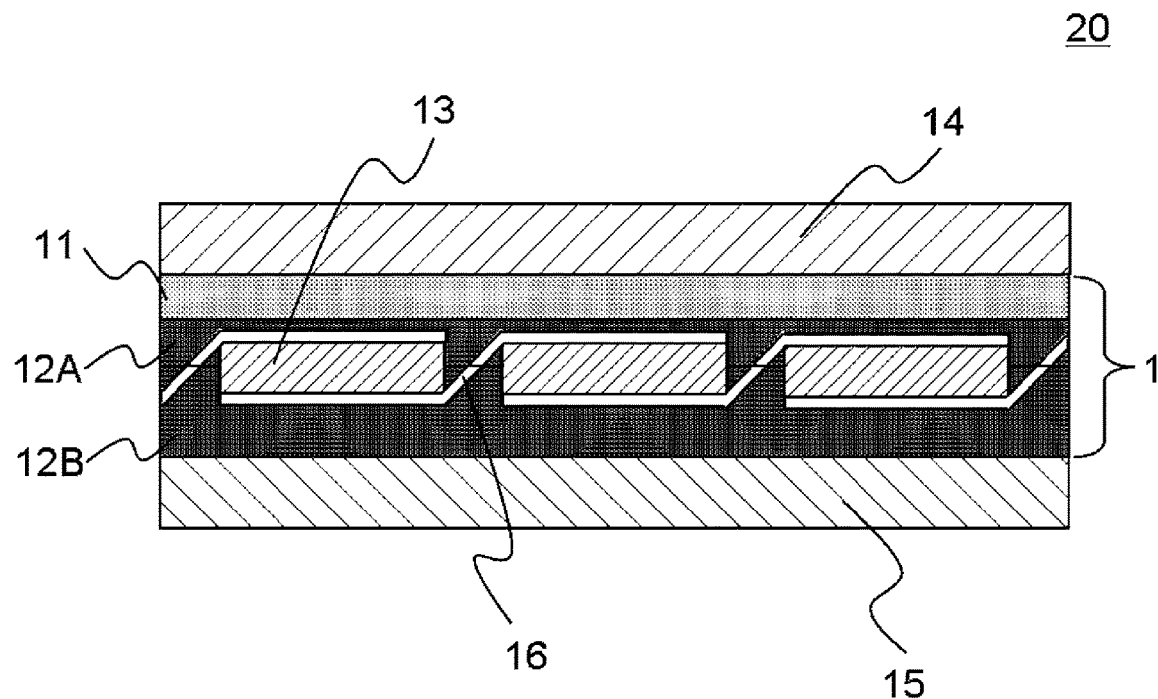
FIG. 2 is a cross-sectional view schematically illustrating a second embodiment of the solar battery module of the invention.

FIG. 2 is a cross-sectional view schematically illustrating a second embodiment of the solar battery module of the invention. A solar battery module 20 illustrated in FIG. 2 is formed using the sheet set for encapsulating a solar battery described in Example 2. In the example of FIG. 2, the first encapsulating sheet is disposed in contact with the light-incident surface protective member 14 so as to form the first encapsulating layer 11, and the relatively thin second encapsulating sheet is disposed in contact with the light-incident surfaces of the solar battery elements 13 so as to form the second encapsulating layer 12A. The relatively thick second encapsulating layer is disposed between the solar battery elements 13 and the back surface protective member 15 so as to form the second encapsulating layer 12B. Other components are the same as those in the solar battery module 10 illustrated in FIG. 1.

Figure 3:
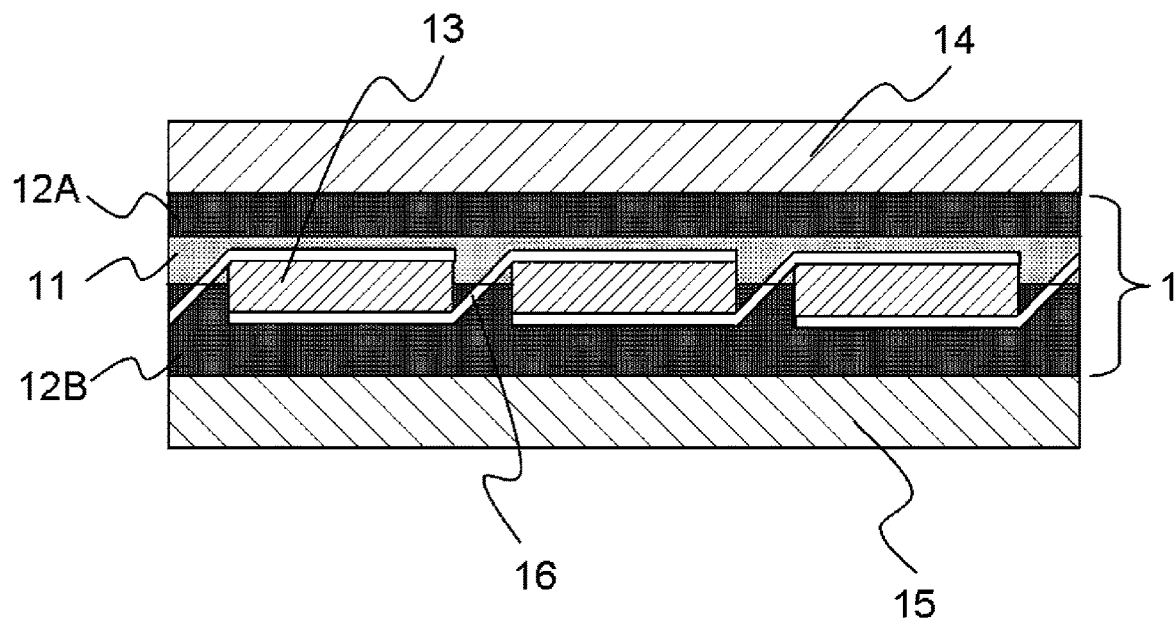
FIG. 3 is a cross-sectional view schematically illustrating a third embodiment of the solar battery module of the invention.

FIG. 3 is a cross-sectional view schematically illustrating a third embodiment of the solar battery module of the invention. A solar battery module 30 illustrated in FIG. 3 is formed using the sheet set for encapsulating a solar battery described in Example 2. In the example of FIG. 3, the relatively thin second encapsulating sheet is disposed in contact with the light-incident surface protective member 14 so as to form the second encapsulating layer 12A, and the relatively thin first encapsulating layer 11 is disposed in contact with the light-incident surfaces of the solar battery elements 13. Other components are the same as those in the solar battery module 20 illustrated in FIG. 2.

Figure 4:
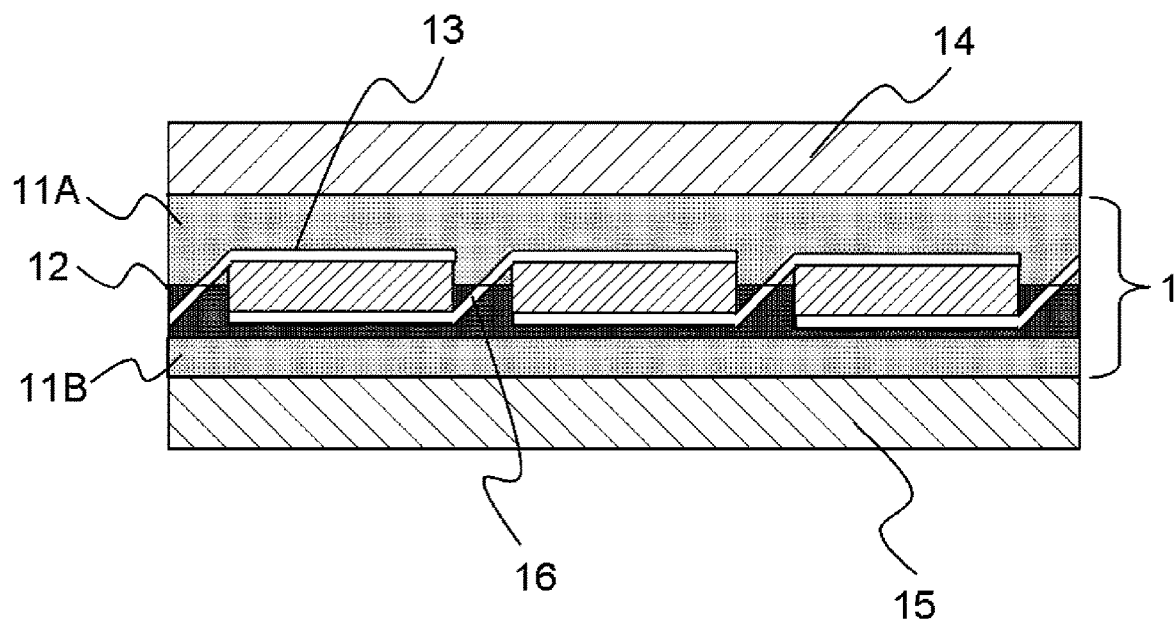
FIG. 4 is a cross-sectional view schematically illustrating a fourth embodiment of the solar battery module of the invention.

FIG. 4 is a cross-sectional view schematically illustrating a fourth embodiment of the solar battery module of the invention. A solar battery module 40 illustrated in FIG. 4 is formed using the sheet set for encapsulating a solar battery described in Example 3.

In the example of FIG. 4, the relatively thin first encapsulating sheet is disposed between the light-incident surface protective member 14 and the solar battery elements 13 so as to form the first encapsulating layer 11A, the relatively thin second encapsulating sheet is disposed in contact with the back surfaces of the solar battery elements 13 so as to form the second encapsulating layer 12, and the relatively thin first encapsulating sheet is disposed in contact with the back surface protective member 15 so as to form the first encapsulating layer 11B. Other components are the same as those in the solar battery module 10 illustrated in FIG. 1.

Figure 5:
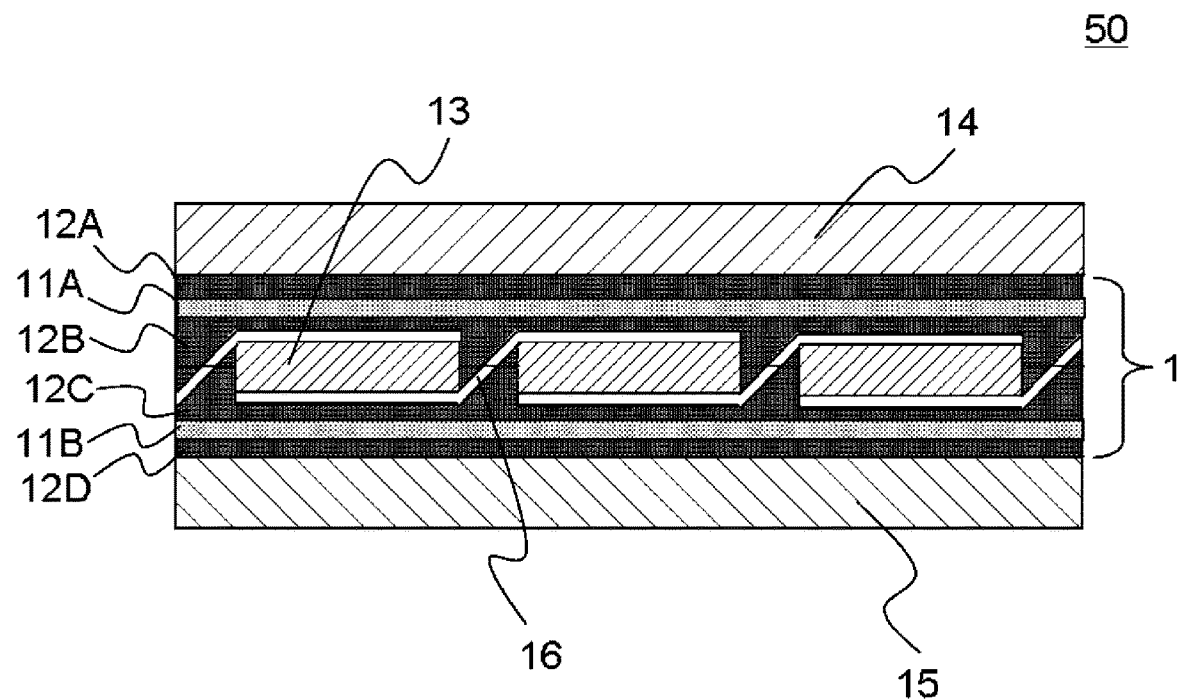
FIG. 5 is a cross-sectional view schematically illustrating a fifth embodiment of the solar battery module of the invention.

FIG. 5 is a cross-sectional view schematically illustrating a fifth embodiment of the solar battery module of the invention. A solar battery module 50 illustrated in FIG. 5 is formed using two sheet sets for encapsulating a solar battery described in Example 4. In the example of FIG. 5, the second encapsulating layer, the first encapsulating layer, and the second encapsulating layer are laminated in this order, and the laminate is disposed between the light-incident surface protective member 14 and the solar battery elements 13, thereby forming the second encapsulating layer 12A, the first encapsulating layer 11A, and the second encapsulating layer 12B. In addition, the laminate of the second encapsulating layer, the first encapsulating layer, and the second encapsulating layer laminated in this order is disposed between the solar battery elements 13 and the back surface protective member 15, thereby forming the second encapsulating layer 12C, the first encapsulating layer 11B, and the second encapsulating layer 12D. Other components are the same as those in the solar battery module 10 illustrated in FIG. 1.

The ratio ($R_1/R_2$) of the volume resistivity $R_1$ (Ω·cm) of the first encapsulating layer 11 (11A and 11B) to the volume resistivity $R_2$ (Ω·cm) of the second encapsulating layer 12 (12A to 12D) is preferably in a range of $1\times10^1$ to $1\times10^{10}$, and more preferably in a range of $1\times10^1$ to $1\times10^5$. Then, in the solar battery modules 10 to 50, it is possible to suppress the occurrence of PID and to reduce the generation of air bubbles.

The volume resistivity ($R_1$) of the first encapsulating layer 11 (11A and 11B) is preferably in a range of $1.0\times10^{13}$ Ω·cm to $1.0\times10^{18}$ Ω·cm, and more preferably in a range of $1.0\times10^{14}$ Ω·cm to $1.0\times10^{18}$ Ω·cm. In addition, the volume resistivity ($R_2$) of the second encapsulating layer 12 is preferably in a range of $1.0\times10^8$ Ω·cm to $1.0\times10^{15}$ Ω·cm, and more preferably in a range of $1.0\times10^{12}$ Ω·cm to $1.0\times10^{15}$ Ω·cm. When $R_1$ and $R_2$ are set within the above-described ranges, it is possible to suppress the occurrence of the PID in the solar battery module for a longer period of time. Here, when the volume resistivity considered as the serial connection of the first layer and the second layer on the light-incident surface is in a range of $1\times10^{12}$ Ω·cm to $1\times10^{17}$ Ω·cm, and more preferably in a range of $1\times10^{12}$ Ω·cm to $1\times10^{15}$ Ω·cm, it is possible to suppress the occurrence of the PID in the solar battery module for a longer period of time in the solar battery modules 10 to 50.

As described above, while the first encapsulating layer 11 can be formed using the first encapsulating sheet, and the second encapsulating layer 12 can be formed using the second encapsulating sheet, when the encapsulating layer 1 is formed by combining the first encapsulating sheet and the second encapsulating sheet so that the volume resistivity of the crosslinked first encapsulating sheet becomes larger than that of the second encapsulating sheet, it is possible to form the encapsulating layer 1 in which the volume resistivity of the first encapsulating layer 11 is higher than the volume resistivity of the second encapsulating layer 12.

Meanwhile, the heating and pressurization treatment of the first encapsulating sheet and the second encapsulating sheet when the volume resistivity is measured is carried out by heating and depressurizing the sheets at 150° C. and 250 Pa for three minutes, and then heating and pressurizing the sheets at 150° C. and 100 kPa for 15 minutes. In addition, as described above, in the specification, the volume resistivity is based on JIS K6911 and is measured at a temperature of 100° C. with an applied voltage of 500 V.

The second encapsulating layer 12 (12A to 12D) is required to contain at least one polar group selected from a carboxylic group, an ester group, a hydroxyl group, an amino group, and an acetal group, and is required to be formed by crosslinking the above-described second encapsulating sheet.

The solar battery modules 10 to 50 illustrated in FIGS. 1 to 5 are specifically examples of a crystalline silicon-based solar battery module. The solar battery elements 13 are a plurality of crystalline silicon-based solar battery elements electrically connected through an interconnector 16, and are sandwiched using the light-incident surface protective member 14 and the back surface protective member 15. Electrodes (collector members) are formed respectively on the light-incident surfaces and back surfaces of the solar battery elements 13, and the electrodes formed on the light-incident surfaces and back surfaces of the solar battery elements 13 are in contact with the encapsulating layer 1. Examples of the collector members include collector lines, tab-type busbars, a back surface electrode layer and the like which will be described below.

The solar battery module 10 illustrated in FIG. 1 is specifically an example of a crystalline silicon-based solar battery module. The solar battery elements 13 are a plurality of crystalline silicon-based solar battery elements electrically connected through an interconnector 16, and are sandwiched using the light-incident surface protective member 14 and the back surface protective member 15. The space between the back surface protective member 14 and a plurality of the solar battery elements 13 is filled with the first encapsulating layer 11, and the space between the back surface protective member 15 and a plurality of the solar battery elements 13 is filled with the second encapsulating layer 12 formed of the second encapsulating sheet. In the first encapsulating layer 11 and the second encapsulating layer 12, the volume resistivity, which is based on JIS K6911 and is measured at a temperature of 100° C. with an applied voltage of 500 V, is preferably higher in the first encapsulating layer 11 than in the second encapsulating layer 12, the first encapsulating layer 11 is preferably formed by crosslinking the above-described first encapsulating sheet, and the second encapsulating layer 12 is preferably formed by crosslinking the above-described second encapsulating sheet. The electrodes formed on the light-incident surfaces of the solar battery elements 13 and the first encapsulating layer 11 are in contact with each other, and the electrodes formed on the back surfaces of the solar battery elements 13 and the second encapsulating layer 12 are in contact with each other. The electrodes are collector members formed respectively on the light-incident surface and back surface of the solar battery elements 13, and examples thereof include collector lines, tab-type busbars, a back surface electrode layer and the like which will be described below.

Figure 6:
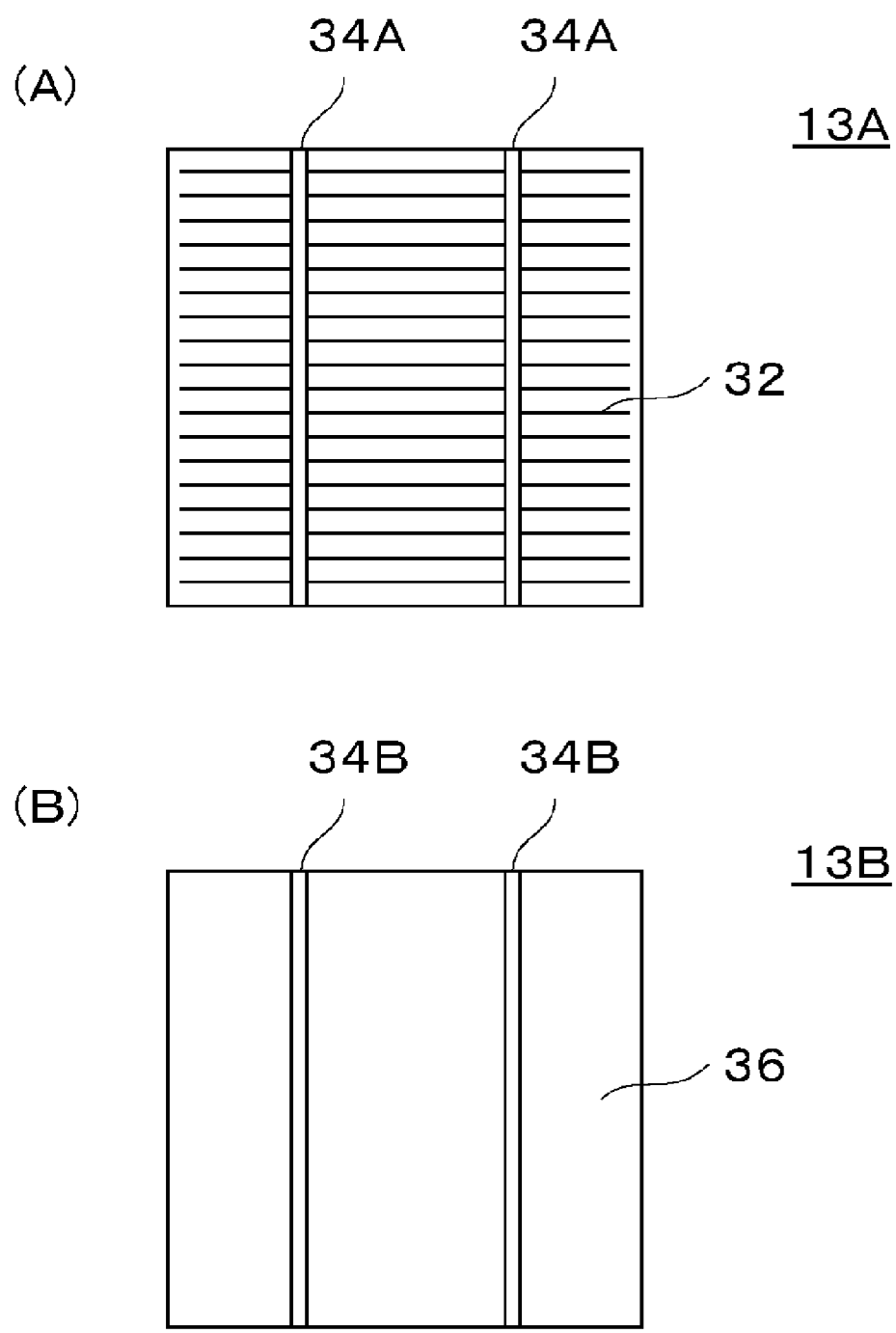
FIG. 6 is a plan view schematically illustrating a configuration example of a light-incident surface and a back surface of a solar battery element.

FIG. 6 is a plan view schematically illustrating a configuration example of the light-incident surface and back surface of the solar battery element. In FIG. 6, an example of the configuration of the light-incident surface 13A and back surface 13B of the solar battery element 13 is illustrated. As illustrated in FIG. 6(A), a number of linearly-formed collector lines 32 and tab-type busbars (busbars) 34A which collect charges from the collector lines 32 and are connected to the interconnector 16 (FIGS. 1 to 5) are formed on the light-incident surface 13A of the solar battery element 13. In addition, as illustrated in FIG. 6(B), a conductive layer 36 (back surface electrode) is formed on the entire back surface 13B of the solar battery element 13, and tab-type busbars (busbars) 34B which collect charges from the conductive layer 36 and are connected to the interconnector 16 (FIGS. 1 to 5) are formed on the conductive layer. The line width of the collector line 32 is, for example, approximately 0.1 mm; the line width of the tab-type busbar 34A is, for example, in a range of approximately 2 mm to 3 mm; and the line width of the tab-type busbar 34B is, for example, in a range of approximately 5 mm to 7 mm. The thicknesses of the collector line 32, the tab-type busbar 34A, and the tab-type busbar 34B are, for example, in a range of approximately 20 μm to 50 μm respectively.

The collector line 32, the tab-type busbar 34A, and the tab-type busbar 34B preferably contain highly conductive metal. Examples of the highly conductive metal include gold, silver, copper and the like, and silver, a silver compound, a silver-containing alloy and the like are preferred due to the high conduction property and high corrosion resistance. The conductive layer 36 preferably contains not only highly conductive metal but also a highly light-reflecting component, for example, aluminum since light incident on the light-incident surface is reflected so as to improve the photoelectric conversion efficiency of the solar battery element. The collector line 32, the tab-type busbar 34A, the tab-type busbar 34B, and the conductive layer 36 are formed by applying a coating material of a conductive material containing the above-described highly conductive metal to the light-incident surface 13A or the back surface 13B of the solar battery element 13 to a thickness of a coated film of 50 μm through, for example, screen printing, then, drying the coated film, and, if necessary, baking the coated film at a temperature in a range of, for example, 600° C. to 700° C.

The light-incident surface protective member 14 is disposed on the light-incident surface side, and is thus required to be transparent. Examples of the light-incident surface protective member 14 include a transparent glass plate, a transparent resin film, and the like. On the other hand, the back surface protective member 15 is not required to be transparent, and a material for the back surface protective member is not particularly limited. Examples of the back surface protective member 15 include a glass substrate, a plastic film, and the like. Examples of a material for the plastic film include films made of a polyester resin, a fluorine resin, an acryl resin, a cyclic olefin (co)polymer, an ethylene-vinyl acetate copolymer, or the like.

The resin film is preferably a polyester resin having excellent transparency, strength, cost, and the like, and particularly, a polyethylene terephthalate resin, a fluorine resin having favorable weather resistance, or the like. Examples of the fluorine resin include an ethylene/tetrafluoroethylene copolymer (ETFE), a polyvinyl fluoride resin (PVF), a polyvinylidene fluoride resin (PVDF), a polytetrafluoroethylene resin (PTFE), a fluorinated ethylene/propylene copolymer (FEP), and a poly trifluorochloroethylene resin (PCTFE). The polyvinylidene fluoride resin is excellent from the viewpoint of weather resistance, and the ethylene tetrafluoroethylene copolymer is excellent in terms of satisfying both weather resistance and mechanical strength. In addition, to improve the adhesiveness to materials configuring other layers, it is desirable to carry out a corona treatment and a plasma treatment on the light-incident surface protective member. In addition, it is also possible to use a sheet that has been subjected to a stretching treatment, for example, a biaxially stretched polypropylene sheet to improve the mechanical strength to improve the mechanical strength.

In a case in which a glass substrate is used as the light-incident surface protective member 14, the total light transmittance of the glass substrate with respect to light having a wavelength in a range of 350 nm to 1400 nm is preferably equal to or more than 80%, and more preferably equal to or more than 90%. It is usual to use as the glass substrate a white glass plate that only slightly absorbs the infrared region, but a blue glass plate has a small influence on the output characteristics of the solar battery module when the blue glass plate has a thickness of equal to or less than 3 mm. In addition, it is possible to obtain reinforced glass through a thermal treatment to increase the mechanical strength of the glass substrate, but a float glass plate that has not been subjected to a thermal treatment may be used. In addition, the light-incident surface side of the glass substrate may be coated for antireflection to suppress reflection.

There is no particular limitation regarding the back surface protective member 15 used for the solar battery modules 10 to 50, but the back surface protective member is located on the outermost surface layers of the solar battery modules 10 to 50, and thus, similar to the above-described light-incident surface protective member 14, is required to have a variety of characteristics such as weather resistance and mechanical strength. Therefore, the back surface protective member 15 may be configured of the same material as for the light-incident surface protective member 14. That is, a variety of the above-described materials used as the light-incident surface protective member 14 can also be used as the back surface protective member 15. Particularly, it is possible to preferably use a polyester resin and glass. In addition, since the back surface protective member 15 is not required to allow the penetration of sunlight, transparency required for the light-incident surface protective member 14 is not essentially required. Therefore, a reinforcement plate may be attached to increase the mechanical strength of the solar battery module 10 or to prevent strain and warpage caused by the temperature change. Examples of the reinforcement plate that can be preferably used include a steel plate, a plastic plate, a fiberglass reinforced plastic (FRP) plate, and the like.

The back surface protective member 15 may be integrated with, among the sheets for encapsulating a solar battery of the invention, the second encapsulating sheet. When the second encapsulating sheet and the back surface protective member 15 are integrated together, it is possible to shorten a step for cutting the second encapsulating sheet and the back surface protective member 15 to a module size when the module is assembled. In addition, it is also possible to shorten and remove the lay-up step by replacing a step in which the second encapsulating sheet and the back surface protective member 15 are separately laid up with a step in which the second encapsulating sheet and the back surface protective member are laid up as an integrated sheet. In a case in which the second encapsulating sheet and the back surface protective member 15 are integrated together, there is no particular limitation regarding the method for laminating the second encapsulating sheet and the back surface protective member 15. The lamination method is preferably a method in which the second encapsulating sheet and the back surface protective member are co-extruded using a well-known melt extruder such as a casting molder, an extrusion sheet molder, an inflation molder or an injection molder, thereby obtaining a laminate or a method in which one layer is melted or laminated by heating on the other layer that has been previously molded, thereby obtaining a laminate.

There is no particular limitation regarding the configuration and material of an electrode used in the solar battery modules 10 to 50; however, in a specific example, the electrode has a laminate structure of a transparent conductive film and a metal film. The transparent conductive film is made of $SnO_2$, ITO, ZnO, or the like. The metal film is made of metal such as silver, gold, copper, tin, aluminum, cadmium, zinc, mercury, chromium, molybdenum, tungsten, nickel, or vanadium. The metal film may be solely used or may be used in a form of a complexed alloy. The transparent conductive film and the metal film are formed using a method such as CVD, sputtering, or deposition.

In FIGS. 1 to 5, the crystalline silicon-based solar battery elements are exemplified as the solar battery elements 13, but there is no particular limitation regarding the solar battery elements as long as the solar battery elements are capable of generating power using a photovoltaic effect of a semiconductor. As the solar battery element, for example, a silicon (monocrystalline silicon, polycrystalline silicon, or non-crystalline (amorphous) silicon) solar battery, a compound semiconductor group, II-VI group, or the like) solar battery, a wet-type solar battery, an organic semiconductor solar battery, or the like can be used. Among the above-described solar batteries, the polycrystalline silicon solar battery is preferred from the viewpoint of the balance between the power generation performance and the cost. It is also possible to replace the solar battery module of FIG. 1 with a thin film silicon-based solar battery module by substituting the crystalline silicon-based solar battery elements 13 with thin film solar battery elements.

A method for manufacturing a solar battery module using the sheet set for encapsulating a solar battery of the invention will be described below using the solar battery module 10 illustrated in FIG. 1 as an example. The manufacturing method includes, for example, (i) a step in which the back surface protective member 15, the second encapsulating sheet, a plurality of the solar battery elements 13, the first encapsulating sheet, and the light-incident surface protective member 14 are laminated in this order, thereby forming a laminate;

(ii) a step in which the laminate is pressurized and bonded using a laminator or the like, and is heated at the same time as necessary; and (iii) a step in which, after the step (ii), a heating treatment is further carried out on the laminate as necessary, and the first and second encapsulating sheets are cured, thereby obtaining the first encapsulating layer 11 from the first encapsulating sheet and the second encapsulating layer 12 from the second encapsulating sheet.

In the step (i), in a case in which an uneven shape (emboss shape) is formed on the first and second encapsulating sheets, the first and second encapsulating sheets are preferably disposed so that an uneven surface faces the solar battery elements 13.

In the step (ii), the laminate obtained in the step (i) is heated and pressurized using a vacuum laminator or a hot press according to an ordinary method so as to be integrated (encapsulated).

In a case in which a vacuum laminator is used, for example, the laminate is heated in a vacuum for three to six minutes under conditions of a temperature in a range of 125° C. to 160° C. and a vacuum pressure of equal to or less than 300 Pa, and then is pressurized at 100 kPa for approximately 1 to 15 minutes. After that, generally, for example, a crosslinking treatment may be carried out on the first and second encapsulating sheets at a temperature in a range of 130° C. to 155° C. for 20 minutes to 60 minutes using a tunnel-type continuous crosslinking furnace or a tray-type batch crosslinking furnace. Alternately, it is also possible to carry out the crosslinking treatment using a vacuum laminator with the heating temperature in the vacuum laminator set in a range of 145° C. to 170° C. and the pressurization time by the atmospheric pressure set in a range of 6 minutes to 30 minutes. Furthermore, after that, the crosslinking treatment may be carried out in the same manner as described above. The crosslinking step may be carried out at the same time as the step (ii) or after the step (ii).

In a case in which the crosslinking treatment step of the first and second encapsulating sheets is carried out after the step (ii), the laminate is heated in a vacuum for three to six minutes under conditions of a temperature in a range of 125° C. to 160° C. and a vacuum pressure of equal to or less than 1.33 kPa in the step (ii), and then, is pressurization using the atmospheric pressure for approximately 1 minute to 15 minutes, thereby integrating the laminate. The crosslinking treatment carried out after the step (ii) can be carried out using an ordinary method, and, for example, a tunnel-type continuous crosslinking furnace may be used, or a tray-type batch crosslinking furnace may be used. In addition, the crosslinking conditions are generally a temperature in a range of 130° C. to 155° C. for approximately 20 minutes to 60 minutes.

Meanwhile, in a case in which the crosslinking treatment step is carried out at the same time as the step (ii), it is possible to carry out the crosslinking step in the same manner as the case in which the crosslinking treatment step is carried out after the step (ii) except for the fact that the heating temperature in the step (ii) is set in a range of 145° C. to 170° C. and the pressurization time by the atmospheric pressure is set in a range of 6 minutes to 30 minutes.

The solar battery module 10 may be manufactured by, at a temperature at which a crosslinking agent is not substantially decomposed and the first and second encapsulating sheets of the invention are melted, temporarily adhering the first encapsulating sheets to the solar battery elements 13 and the light-incident surface protective member 14, temporarily adhering the second encapsulating sheets to the solar battery elements 13 and the back surface protective member 15, and then increasing the temperature, thereby carrying out sufficient adhering and the crosslinking of the encapsulating sheets. An additive prescription with which a variety of conditions can be satisfied may be selected, and, for example, the type and impregnation amount of the above-described crosslinking agent, the above-described crosslinking aid, and the like may be selected.

It is also possible to hold the strength by providing an aluminum frame to the outer frame of the solar battery module 100 manufactured in the above-described manner. In addition, the aluminum frame is preferably earthed (grounded) from the viewpoint of safety. It is also possible to construct a small-scale solar battery system for residential use or a large-scale solar battery system called a mega solar battery system by connecting several or several tens of the above-described solar battery modules in series.

The solar battery module of the invention may appropriately include arbitrary members within the scope of the purpose of the invention. Typically, it is possible to provide an adhering layer, a shock absorbing layer, a coating layer, an anti-reflection layer, a back surface re-reflection layer, a light diffusion layer, and the like, and the members are not limited thereto. There is no particular limitation regarding the locations at which the above-described members are provided, and the members can be provided at appropriate locations in consideration of the purpose of the provision of the layers and the characteristics of the layers.

In addition, the lamination may be carried out using a dry laminate method, a heat laminate method, or the like in which an appropriate adhesive (for example, a maleic acid anhydride-modified polyolefin resin (product name "ADOMER (registered trademark)" manufactured by Mitsui Chemicals, Inc., "MODIC (registered trademark)" manufactured by Mitsubishi Chemical Corporation or the like), a low (non) crystalline soft polymer such as an unsaturated polyolefin, an acrylic adhesive including an ethylene/acrylic acid ester/maleic acid anhydride-ternary copolymer (trade name "BONDINE (registered trademark)" manufactured by Sumika CdF Chemical Company Limited.), an ethylene/ vinyl acetate-based copolymer, an adhesive resin composition containing what has been described above, or the like) is used.

The adhesive is preferably an adhesive having heat resistance in a range of approximately 120° C. to 150° C., and specifically, a polyester-based adhesive, a polyurethane-based adhesive, or the like is preferred. In addition, to improve the adhesiveness between both layers, for example, a silane-based coupling treatment, a titanium-based coupling treatment, a corona treatment, a plasma treatment or the like may be carried out on at least one layer.

The solar battery module of the invention is excellent in terms of productivity, power generation efficiency, service life, and the like. Therefore, a power generation facility using the above-described solar battery module is excellent in terms of cost, power generation efficiency, service life, and the like, and has a high practical value. The above-described power generation facility is preferable for long-term indoor and outdoor use so as to be used as an outdoor mobile power supply for camping and the like, which is installed outside houses, or to be used as an auxiliary power supply for automobile batteries.

According to the solar battery module, since the encapsulating layer having a polar group is provided, it is possible to absorb gas generated by increasing the temperature during the use in the encapsulating layer, and therefore it is possible to avoid a trouble such as the deformation of the encapsulating layer and to prevent the cracking of a cell without impairing the appearance of the solar battery, and the economic aspect such as cost is excellent. In addition, according to the solar battery module, since the highly resistant encapsulating layer is provided in the light-incident surface, when a solar battery array is produced, it is possible to significantly suppress the occurrence of PID even when a state in which a high voltage is applied between the frame and the solar battery cell elements is maintained.

Thus far, the embodiments of the invention have been described with reference to the accompanying drawings, but the embodiments are simply examples of the invention, and the invention is still capable of employing a variety of configurations other than the above-described configuration.

Example 1

Hereinafter, the invention will be specifically described based on examples, but the invention is not limited to the examples.

(1) Measurement Method

MFR

MFR was based on ASTM D1238, and was measured under conditions of a temperature of 190° C. and a load of 2.16 kg.

[The Content of an Aluminum Element]

After the ethylene/α-olefin copolymer was wet-decomposed, the volume was made to be constant using pure water, the amount of aluminum was determined using an ICP emission spectrometer (ICPS-8100 manufactured by Shimadzu Corporation), and the content of an aluminum element was obtained.

[The Shore A Hardness]

After the ethylene/α-olefin copolymer was heated at 190° C. for four minutes and pressurized at 10 MPa, the ethylene/α-olefin copolymer was pressurized and cooled at 10 MPa to room temperature for five minutes, thereby obtaining a 3 mm-thick sheet. The shore A hardness of the ethylene/α-olefin copolymer was measured on the basis of ASTM D2240 using the obtained sheet.

[Density]

The density of the ethylene/α-olefin copolymer was measured on the basis of ASTM D1505.

[B Value]

The B value of the ethylene/α-olefin copolymer was computed from the above-described $^{13}$C-NMR spectrum according to the following equation (1).

$$B\text{value}=[P_{OE}]/(2\times[P_O]\times[P_E]) \quad (1)$$

(In the equation (1), $[P_E]$ represents the proportion (molar fraction) of the structural unit derived from ethylene in the ethylene/α-olefin copolymer, $[P_O]$ represents the proportion (molar fraction) of the structural unit derived from an α-olefin having 3 to 20 carbon atoms in the ethylene/α-olefin copolymer, and $[P_{OE}]$ represents the proportion (molar fraction) of α-olefin-ethylene chains in all dyad chains.)

[Tαβ/Tαα]

The "Tαβ/Tαα" of the ethylene/α-olefin copolymer was computed from the above-described $^{13}$C-NMR spectrum with reference to the description of the above-described documents.

[Molecular Weight Distribution Mw/Mn]

The molecular weight distribution (Mw/Mn) was measured in the following manner using a gel permeation chromatography manufactured by Waters (trade name: "ALLIANCE GPC-2000"). Two TSKgel GMH6-HT (trade name) columns and two TSKgel GMH6-HTL (trade name) columns were used as separation columns. Regarding the column size, an inner diameter of 7.5 mm and a length of 300 mm were provided to all columns, the column temperature was set to 140° C., o-dichlorobenzene (manufactured by Wako Pure Chemical Industries, Ltd.) was used as a mobile phase, and 0.025 weight % of BHT (manufactured by Takeda Pharmaceutical Company Limited) was used as an antioxidant. The mobile phase was moved at a rate of 1.0 ml/minute so as to set the specimen concentration to 15 mg/10 ml, the specimen injection amount was set to 500 μl, and a differential refractometer was used as a detector. Polystyrene manufactured by Tosoh Corporation was used as the standard polystyrene for the ethylene/α-olefin copolymer having a molecular weight satisfying Mw<1000 and Mw>4×10$^6$, and polystyrene manufactured by Pressure Chemical Corporation was used as the standard polystyrene for the ethylene/α-olefin copolymer having a molecular weight satisfying 1000≤Mw≤4×10$^6$. The molecular weight was the value of the ethylene/α-olefin copolymer converted in accordance with each of the used α-olefins through universal correction.

[The Content Ratio of Chlorine Ions]

The content ratio of chlorine ions was measured using an extraction liquid, which was obtained by precisely weighing approximately 10 g of the ethylene/α-olefin copolymer in a glass container that had been sterilized and washed using an autoclave or the like, adding 100 ml of ultrapure water, closely encapsulating the glass container, and then carrying out ultrasonic wave (38 kHz) extraction at room temperature for 30 minutes, and an ion chromatography device manufactured by Dionex Ltd. (trade name "ICS-2000").

[The Extraction Amount into Methyl Acetate]

The extraction amount into methyl acetate was computed by precisely weighing approximately 10 g of the ethylene/α-olefin copolymer, carrying out Soxhlet extraction at a warm water bath temperature of 90° C. for three hours using methyl acetate, and using the difference in the weight of the ethylene/α-olefin copolymer before and after the extrusion or the residue amount obtained after the extracted solvent is volatilized.

[Volume Resistivity]

After the first and second encapsulating sheets of the solar battery sheet were cut into a size of 10 cm×10 cm respectively, the sheets were laminated using a lamination apparatus (LM-110×160S manufactured by NPC Corporation) under conditions of 150° C., a vacuum pressure of 250 Pa for three minutes and a pressurization pressure of 100 kPa for 15 minutes, thereby producing a crosslinked sheet for measurement. The volume resistivity (Ω·cm) of the produced crosslinked sheet was measured at an applied voltage of 500 V on the basis of JIS K6911. Meanwhile, during the measurement, the temperature was set to 100±2° C. using a high-temperature measurement chamber "12708" (manufactured by Advantest Corporation), and a microammeter "R8340A" (manufactured by Advantest Corporation) was used.

[The Acetone and t-Butanol-Absorbing Ratios]

After the first and second encapsulating sheets of the solar battery sheet were cut into a size of 10 cm×10 cm, the sheets were laminated using a lamination apparatus (LM-110× 160S manufactured by NPC Corporation) under conditions of 150° C., a vacuum pressure of 250 Pa for three minutes and a pressurization pressure of 100 kPa for 15 minutes, thereby producing a 0.5 mm-thick crosslinked sheet for measurement. The obtained crosslinking-treated sheets were cut so as to be capable of being put into a closed container, and approximately 1 g of the sheets were weighed using a precision scale. After the weighing, the sheets were put into the 100 ml closed container filled with 10 ml of acetone, and were immersed at 23° C. for one hour. After one hour, acetone attached to the sheet surfaces was wiped away using KIMWIPE or the like, and the sheets after the test were weighed using the precision scale. The acetone-absorbing ratio was computed from the difference in weight before and after the test. Regarding the t-butanol as well, the t-butanol-absorbing ratio was computed in the same manner except for the fact that the t-butanol immersion temperature condition was changed to 30° C.

(2) the Synthesis of the Ethylene/α-Olefin Copolymer

Synthesis Example 1

A toluene solution of methyl aluminoxane was supplied as a co-catalyst at a rate of 8.0 mmol/hr, a hexane slurry of bis(1,3-dimethylcyclopentadienyl) zirconium dichloride and a hexane solution of triisobutylaluminum were supplied at rates of 0.025 mmol/hr and at 0.5 mmol/hr respectively as main catalysts to one supply opening of a continuous polymerization vessel having stirring blades and an inner volume of 50 L, and normal hexanone which was used as a catalyst solution and a polymerization solvent and was dehydrated and purified so that the total of the dehydrated and purified normal hexanone became 20 L/hr was continuously supplied. At the same time, ethylene, 1-butene and hydrogen were continuously supplied at rates of 3 kg/hr, 15 kg/hr and 5 NL/hr respectively to another supply opening of the polymerization vessel, and continuous solution polymerization was carried out under conditions of a polymerization temperature of 90° C., a total pressure of 3 MPaG, and a retention time of 1.0 hour. The normal hexane/toluene solution mixture of the ethylene/α-olefin copolymer generated in the polymerization vessel was continuously exhausted through an exhaust opening provided in the bottom portion of the polymerization vessel, and was guided to a coupling pipe in which a jacket portion was heated using 3 kg/cm$^2$ to 25 kg/cm$^2$ steam so that the normal hexane/toluene solution mixture of the ethylene/α-olefin copolymer reached a temperature in a range of 150° C. to 190° C. Meanwhile, a supply opening through which methanol that was a catalyst-devitalizing agent was injected was provided immediately before the coupling pipe, and methanol was injected at a rate of approximately 0.75 L/hr so as to combine with the normal hexane/toluene solution mixture of the ethylene/α-olefin copolymer. The normal hexane/toluene solution mixture of the ethylene/α-olefin copolymer maintained at approximately 190° C. in the steam jacket-equipped coupling pipe was continuously sent to a flash chamber by adjusting the degree of the opening of a pressure control valve provided at the terminal portion of the coupling pipe so as to maintain approximately 4.3 MPaG. Meanwhile, when the normal hexane/toluene solution mixture was sent to the flash chamber, the solution temperature and the degree of the opening of the pressure-adjusting valve were set so that the pressure in the flash chamber was maintained at approximately 0.1 MPaG and the temperature of a vapor portion in the flash chamber was maintained at 180° C. After that, a strand was cooled in a water vessel through a single screw extruder in which the die temperature was set to 180° C., and the strand was cut using a pellet cutter, thereby obtaining an ethylene/α-olefin copolymer in a pellet form. The yield was 2.2 kg/hr. The properties are described in Table 1.

Synthesis Example 2

An ethylene/α-olefin copolymer was obtained in the same manner as in Synthesis Example 1 except for the fact that a hexane solution of [dimethyl(t-butylamide)(tetramethyl-η5-cyclopentadienyl)silane]titandichloride was supplied as a main catalyst at a rate of 0.012 mmol/hr, a toluene solution of triphenylcarbenium(tetrakis-pentafluorophenyl) borate and a hexane solution of triisobutylaluminum were supplied at rates of 0.05 mmol/hr and 0.4 mmol/hr respectively as co-catalysts, and 1-butene and hydrogen were supplied at rates of 5 kg/hr and 100 NL/hr respectively. The yield was 1.3 kg/hr. The properties are described in Table 1.

Synthesis Example 3

An ethylene/α-olefin copolymer was obtained in the same manner as in Synthesis Example 1 except for the fact that a hexane solution of bis(p-tolyl)methylene(cyclopentadienyl) (1,1,4,4,7,7,10,10-octamethyl-1,2,3,4,7,8,9,10-octahydrodibenzo(b,h)-fluorenyl) zirconium dichloride was supplied as a main catalyst at a rate of 0.003 mmol/hr; a toluene solution of methyl aluminoxane and a hexane solution of triisobutylaluminum were supplied at rates of 3.0 mmol/hr and 0.6 mmol/hr respectively as co-catalysts; ethylene was supplied at a rate of 4.3 kg/hr; 1-octene was supplied instead of 1-butene at a rate of 6.4 kg/hr; dehydrated and purified normal hexanone was continuously supplied so that the total of 1-octane and the dehydrated and purified normal hexanone which was used as a catalyst solution and a polymerization solution became 20 L/hr; hydrogen was supplied at a rate of 60 NL/hr; and the polymerization temperature was set to 130° C. The yield was 4.3 kg/hr. The properties are described in Table 1.

TABLE 1

|  | Synthesis Example 1 | Synthesis Example 2 | Synthesis Example 3 |
|---|---|---|---|
| α-olefin type | 1-butene | 1-butene | 1-octene |
| Content ratio of α-olefin unit [mol %] | 14 | 17 | 11 |
| Content ratio of ethylene unit [mol %] | 86 | 83 | 89 |
| MFR [g/10 minutes] | 20 | 11 | 48 |
| Al residue amount [ppm] | 102 | 8 | 23 |
| Density [g/cm$^3$] | 0.870 | 0.866 | 0.884 |
| Shore A hardness [—] | 70 | 62 | 84 |
| B value [—] | 1.11 | 1.07 | 1.16 |
| Tαβ/Tαα [—] | <0.01 | 0.4 | <0.01 |
| Mw/Mn [—] | 2.2 | 2.2 | 2.1 |
| Content ratio of chlorine ions [ppm] | 1 | 0.4 | 0.1 |
| Extraction amount of methyl acetate [weight %] | 0.7 | 1.8 | 0.8 |

(3) the Synthesis of a Modified Polyvinyl Butyral Resin

Synthesis Example 4

100 g of polyvinyl alcohol (manufactured by Kuraray Co. Ltd., PVA-117) having an ethylene content of 15 mol %, a saponification degree of 98 mol %, and an average polymerization degree of 1700 was melted in distilled water, thereby obtaining an aqueous solution of polyvinyl alcohol having a concentration of 10 weight %. 32 g of 35 weight % hydrochloric acid was added while stirring the aqueous solution in a state of being set at 40° C. using anchor-type stirring blades, and 60 g of butyl aldehyde was added dropwise. After the precipitation of the polyvinyl butyral resin in the aqueous solution was confirmed, the aqueous solution was heated to 50° C. and was stirred for four hours while 64 g of 35 weight % hydrochloric acid was added, thereby completing the reaction, and obtaining a dispersion fluid of a modified polyvinyl butyral resin. The obtained dispersion fluid was cooled, was neutralized using an aqueous solution of 30 weight % sodium hydroxide so as to reach a pH of the dispersion fluid of 7.5, was filtered, was washed using distilled water in an amount that was 20 times larger the amount of the polymer, and was dried, thereby obtaining a modified polyvinyl butyral resin having an average polymerization degree of 1700 and an acetylation degree of 65 mol %.

(4) the First and Second Encapsulating Sheets

Manufacturing Example 1

0.5 parts by weight of γ-methacryloxypropyltrimethoxy silane as an ethylenic unsaturated silane compound, 1.0 part by weight of t-butylperoxy-2-ethylhexyl carbonate having a one-minute half-life temperature of 166° C. as the organic peroxide, 1.2 parts by weight of triallyl isocyanurate as the crosslinking aid, 0.4 parts by weight of 2-hydroxy-4-normal-octyloxybenzophenone as the ultraviolet absorber, 0.2 parts by weight of bis(2,2,6,6-tetramethyl-4-piperidyl)sebacate as a radical-trapping agent, 0.05 parts by weight of tris(2,4-di-tert-butylphenyl)phosphite as a heat-resistant stabilizer 1, and 0.1 parts by weight of octadecyl-3-(3,5-di-tert-butyl-4-hydroxyphenyl) propionate as a heat-resistant stabilizer 2 were blended with respect to 100 parts by weight of the ethylene/α-olefin copolymer of Synthetic Example 1. A coat hanger T die (with a lip shape: 270 mm×0.8 mm) was mounted in a single screw extruder (with a screw diameter of 20 mmφ, L/D=28) manufactured by Thermoplastic Company, and molding was carried out at a roll temperature of 30° C. and a winding rate of 1.0 m/min under a condition of a die temperature of 100° C. using an embossing roll as a first cooling roll, thereby obtaining a 0.5 mm-thick embossed encapsulating sheet. The porosity of the obtained sheet was 28%.

Manufacturing Example 2

Additives described below were blended with 100 parts by mass of an ethylene/vinyl acetate polymer containing 26 weight % of vinyl acetate and having MFR of 15 g/10 minutes, and were kneaded under conditions of 100° C., for five minutes, and 30 rpm using a laboplasto mill (manufactured by Toyo Seiki Co., Ltd.), thereby obtaining a resin composition containing the ethylene/vinyl acetate polymer (EVA in Table 2). The obtained composition was set into a sheet inside the frame using a vacuum laminator and a 0.5 mm-thick SUS metal frame having a 25 cm×25 cm opening section, and a 0.5 μm-thick flat encapsulating sheet was produced with a vacuum time of three minutes and a pressurization time of ten minutes at a hot plate temperature of 100° C.

<Organic peroxide>2,5-dimethyl-2,5-bis(t-butylperoxy) hexane
1.3 parts by weight
<Crosslinking aid> triallyl isocyanurate 1.5 parts by weight
<Ethylenic unsaturated silane compound>γ-methacryloxypropyltrimethoxy silane 0.3 parts by weight
<Radical-trapping agent>
bis(2,2,6,6,-tetramethyl-4-piperidyl)sebacate 0.1 parts by weight
<Ultraviolet absorber>2-hydroxy-4-n-octyloxybenzophenone 0.2 parts by weight
<Heat-resistant stabilizer 1> butylhydroxy toluene 0.01 parts by weight Manufacturing Examples 3 and 4

Embossed encapsulating sheets were obtained in the same manner as in Example 1 except for the fact that the components were blended as described in Table 2. The porosities of the obtained sheets were all 28%.

Manufacturing Example 5

100 parts by weight of the modified polyvinyl butyral resin of Synthetic Example 4 and 45 parts by weight of triethylene glycol-di-2-ethylhexanoate as a plasticizer were kneaded under conditions of at 160° C. and 100 rpm for ten minutes using a laboplasto mill (manufactured by Toyo Seiki Co., Ltd.), thereby obtaining a modified polyvinyl butyral resin composition (PVB in Table 2). MFR of the obtained composition was 0.6 g/10 minutes. The obtained composition was set into a sheet inside the frame using a vacuum laminator and a 0.5 mm-thick SUS metal frame having a 25 cm×25 cm opening section, and a 0.5 μm-thick flat encapsulating sheet was produced with a vacuum time of three minutes and a pressurization time of ten minutes at a hot plate temperature of 100° C.

TABLE 2

| | | | Manufacturing Example 1 | Manufacturing Example 2 | Manufacturing Example 3 | Manufacturing Example 4 | Manufacturing Example 5 |
|---|---|---|---|---|---|---|---|
| Blending (parts by weight) | Ethylene/α-olefin copolymer | Synthetic Example 1 | 100 | | | | |
| | | Synthetic Example 2 | | | 100 | | |
| | | Synthetic Example 3 | | | | 100 | |
| | EVA | | | 100 | | | |
| | PVB (synthesis Example 4) | | | | | | 100 |
| | Ethylenic unsaturated silane compound | | 0.5 | 0.3 | 0.5 | 0.5 | |
| | Organic peroxide | | 1.0 | 1.3 | 1.0 | 1.0 | |
| | Crosslinking aid | | 1.2 | 1.5 | 1.2 | 1.2 | |
| | Ultraviolet absorber | | 0.4 | 0.2 | 0.4 | 0.4 | |
| | Radical-trapping agent | | 0.2 | 0.1 | 0.2 | 0.2 | |
| | Heat-resistant stabilizer 1 | | 0.05 | 0.01 | 0.05 | 0.1 | |
| | Heat-resistant stabilizer 2 | | 0.1 | | 0.1 | 0.1 | |
| Evaluation | Volume resistivity at 100° C. (Ω · cm) | | $2.0 \times 10^{15}$ | $3.2 \times 10^{12}$ | $1.2 \times 10^{15}$ | $4.2 \times 10^{15}$ | $\leq 1 \times 10^{8}$ |
| | Aceton-absorbing ratio (weight %) | | 3.2 | 22.4 | 3.6 | 3.0 | 163 |
| | t-butanol-absorbing ratio (weight %) | | 2.3 | 11.2 | 2.5 | 2.2 | 22.5 |

Examples 1 to 4 and Comparative Examples 1 and 2

A pair of sheets for encapsulating a solar battery was prepared by combining the encapsulating sheets of Manufacturing Examples 1 to 5 as described in Table 3, a module of a model as described below was produced, and "PID evaluation", "air bubbles", and "cracking in the solar battery element" were evaluated. The results are described in Table 3. First, the ratio ($R_1/R_2$) of the volume resistivity $R_1$ of the first encapsulating sheet to the volume resistivity $R_2$ of the second encapsulating sheet, the difference ($A_2-A_1$) between the acetone-absorbing ratio ($A_2$) of the second encapsulating sheet and the acetone-absorbing ratio ($A_1$) of the first encapsulating sheet, and the difference ($B_2-B_1$) between the t-butanol-absorbing ratio ($B_2$) of the second encapsulating sheet and the t-butanol-absorbing ratio ($B_1$) of the first encapsulating sheet were also described in Table 3.

(5) Evaluation

PID Evaluation

A solar battery module was produced using a vacuum laminator by setting the first encapsulating sheet between the light-incident protective member and the solar battery elements, and setting the second encapsulating sheet between the solar battery elements and the back surface protective member, and PID evaluation was carried out. The configuration used in the module for the evaluation was a small module in which monocrystalline cells were used as the solar battery elements and 18 cells were connected in series. A 3.2 mm-thick embossed and thermally-treated glass plate obtained by cutting a white float glass plate manufactured by AGC Fabritech Co., Ltd. into a size of 24 cm×21 cm was used as the light-incident surface protective member. A cell (a monocrystalline cell manufactured by Shinsung Solar Energy Co., Ltd.) with a busbar silver electrode placed in the center of the light-incident surface and cut into a size of 5 cm×3 cm was used as the solar battery element. Eighteen cells were connected in series using a copper ribbon electrode obtained by coating the surface of a copper foil with eutectic solder. A PET-based backsheet including silica-deposited PET was used as the back surface protective member, an approximately 2 cm-long cut was made in a part of the backsheet using a cutter knife as an extraction portion from the cell, and a positive terminal and a negative terminal of the 18 cells connected in series were extracted. The components were laminated using a vacuum laminator (LM-110×160-S manufactured by NPC Corporation) under conditions of a hot plate temperature of 150° C., a vacuum time of three minutes and a pressurization time of 15 minutes. After that, the encapsulating sheet and the backsheet spreading out of the glass sheet were cut, an end surface encapsulating material was supplied to the glass plate edge, thereby attaching an aluminum frame, and RTV silicone was supplied and cured at the cut portions of the terminal portion extracted from the backsheet. The positive terminal and the negative terminal of the mini module were short-circuited, and a high voltage-side cable of a power supply was connected. In addition, a low voltage-side cable of the power supply was connected to the aluminum frame, and the aluminum frame was earthed. The module was set in a constant temperature and humidity tank at 85° C. and 85% RH, −600 V was applied after waiting for an increase in the temperature, and then the module was held under the application of the voltage for 24 hours. A HARb-3R10-LF (manufactured by Matsusada Precision Inc.) was used as a high-voltage power supply, and a FS-214C2 (manufactured by Etac Engineering Co., Ltd.) was used as the constant temperature and humidity tank. After the test, the IV characteristics of the module were evaluated using a xenon light source having a light intensity distribution of an air mass (AM) 1.5 class A. A PVS-116i-S manufactured by Nisshinbo Mechatronics Inc. was used in the IV evaluation.

The evaluation results were classified as described below.

Based on the initial value, when a decrease in the maximum output power $P_{max}$ of the IV characteristics after the test was equal to or less than 5%: A more than 5%: C Meanwhile, in the modules for evaluation of the examples and the comparative examples, as a result of measuring the volume resistivity of the first encapsulating layer formed of the first encapsulating sheet and the volume resistivity of the second encapsulating layer formed of the second encapsulating sheet, in the modules for evaluation produced using the sheet sets for encapsulating a solar battery of Examples 1 to 4, it was confirmed that the volume resistivity of the first encapsulating layer was higher than the volume resistivity of the second encapsulating layer formed of the second encapsulating sheet, and the first encapsulating layer and the second encapsulating layer of Comparative Examples 1 and 2 had the same volume resistivity. Meanwhile, the volume resistivity of the first encapsulating layer and the second encapsulating layer of Comparative Examples 1 and 2 was measured at a temperature of 100° C. with an applied voltage of 500 V on the basis of JIS K6911 using the method described in the embodiments after the test specimen had been cut out.

[Air Bubble]

The first encapsulating sheet was placed on a blue glass plate (3 mm-thick, 12 cm×7.5 cm), then, two 0.2 mm-thick 3 cm×3 cm aluminum plates were placed on the blue glass plate at intervals of 2 cm, and were fixed using a polytetrafluoroethylene/based adhesion tape having a width of 1 cm and a length of 3 cm. Next, the second encapsulating sheet was further placed on the aluminum plates, finally, a PET-based backsheet was overlaid, was attached using a lamination apparatus (LM-110×160S manufactured by NPC Corporation) under conditions of 150° C., a vacuum pressure of 250 Pa for three minutes and a pressurization pressure of 100 kPa for 15 minutes, and then the appearance of the crosslinked and adhered encapsulating sheets were observed (initial swollenness). Furthermore, the encapsulating sheets were put into an oven at 130° C., and the appearance was observed after a heat resistance test was carried out for one hour (swollenness after the heat resistance test). The generation of air bubbles was evaluated according to the following criteria.

A: There was no particular change in the appearance.

B: The shape slightly changed at places where the adhesion tape was attached.

C: The encapsulating sheets were swollen at places where the adhesion tape was attached.

[Cracking in the Solar Battery Element]

A 150 μm-thick silicon-type solar battery element was cut and sampled from an ingot, and a white glass plate/the first encapsulating sheet/the silicon-type solar battery element/the second encapsulating sheet/a PET backsheet were attached together using a lamination apparatus (LM-110×160S manufactured by NPC Corporation) under conditions of 150° C., a vacuum pressure of 250 Pa for three minutes and a pressurization pressure of 100 kPa for 15 minutes, thereby obtaining a laminate. The silicon-type solar battery element in the obtained laminate was visually observed, and cracking was evaluated.

Examples 1 to 4, there was no PID phenomenon observed, and there was no generation of air bubbles or the cracking in the elements. In the modules of FIGS. 3 and 5, the adhesiveness between glass and the encapsulating layer is particularly excellent.

The present application claims priority based on Japanese Patent Application No. 2012-044739 filed on Feb. 29, 2012 and Japanese Patent Application No. 2012-087734 filed on Apr. 6, 2012, the contents of which are incorporated herein by reference.

The invention includes the following aspects.

[A1]

A sheet set for encapsulating a solar battery including:

a first encapsulating sheet and a second encapsulating sheet which are disposed between a light-incident surface protective member and a back surface protective member, and are used to encapsulate solar battery elements, in which, when the first encapsulating sheet and the second encapsulating sheet are subjected to a crosslinking treatment in which the first encapsulating sheet and the second encapsulating sheet are heated and depressurized at 150° C. and 250 Pa for three minutes, and then are heated and pressurized at 150° C. and 100 kPa for 15 minutes, a volume resistivity of the crosslinking-treated first encapsulating sheet, which is based on JIS K6911 and is measured at a temperature of 100° C. with an applied voltage of 500 V, is higher than a volume resistivity of the second encapsulating sheet, and the second encapsulating sheet has at least one polar group selected from a carboxyl group, an ester group, a hydroxyl group, an amino group, and an acetal group.

[A2]

The sheet set for encapsulating a solar battery according to [A1], in which the first encapsulating sheet is disposed between the light-incident surface protective member and the solar battery elements.

[A3]

The sheet set for encapsulating a solar battery according to [A1] or [A2], in which the polar group includes at least one selected from a carboxyl group and an ester group.

TABLE 3

|  | Example 1 | Example 2 | Example 3 | Example 4 | Comparative Example 1 | Comparative Example 2 |
|---|---|---|---|---|---|---|
| First encapsulating sheet | Manufacturing Example 1 | Manufacturing Example 3 | Manufacturing Example 4 | Manufacturing Example 1 | Manufacturing Example 2 | Manufacturing Example 5 |
| Second encapsulating sheet | Manufacturing Example 2 | Manufacturing Example 2 | Manufacturing Example 2 | Manufacturing Example 5 | Manufacturing Example 2 | Manufacturing Example 5 |
| $R_1/R_2$ | $6.3 \times 10^2$ | $3.8 \times 10^2$ | $1.3 \times 10^3$ | $\geq 2 \times 10^5$ | 1 | 1 |
| $A_2 - A_1$ | 19.2 | 18.8 | 19.4 | 159.8 | 0 | 0 |
| $B_2 - B_1$ | 8.9 | 8.7 | 9.0 | 20.2 | 0 | 0 |
| PID | A | A | A | A | C | C |
| Air bubbles | A | A | A | A | A | B |
| Cracking in solar battery element | A | A | A | A | A | A |

In the solar battery modules of Examples 1 to 4, there was no PID phenomenon observed, no generation of air bubbles or no cracking in the elements. On the contrary, in Comparative Example 1, the PID phenomenon was observed. In Comparative Example 2, not only the PID phenomenon but also the generation of air bubbles were observed.

In addition, when solar battery modules having the structures illustrated in FIGS. 2 to 5 were produced by using the sheet of Manufacturing Example 1 as the first encapsulating sheet and using the sheet of Manufacturing Example 2 as the second encapsulating sheet, similar to the modules of

[A4]

The sheet set for encapsulating a solar battery according to any one of [A1] to [A3], in which the first encapsulating sheet and the second encapsulating sheet are laminated and disposed between the light-incident surface protective member and the solar battery elements.

[A5]

The sheet set for encapsulating a solar battery according to [A4], in which the first encapsulating sheet and the second encapsulating sheet are disposed in contact with each other.

[A6]

The sheet set for encapsulating a solar battery according to any one of [A1] to [A5], in which the second encapsulating sheet is disposed in contact with the light-incident surface protective member.

[A7]

The sheet set for encapsulating a solar battery according to any one of [A1] to [A6], in which the first encapsulating sheet and the second encapsulating sheet are laminated.

[A8]

The sheet set for encapsulating a solar battery according to any one of [A1] to [A7], including a plurality of the first encapsulating sheets, in which the second encapsulating sheet is sandwiched in the first encapsulating sheets and is disposed between the light-incident surface protective member and the back surface protective member.

[A9]

The sheet set for encapsulating a solar battery according to any one of [A1] to [A7], including a plurality of the second encapsulating sheets, in which the first encapsulating sheet is sandwiched in the second encapsulating sheets and is disposed between the light-incident surface protective member and the back surface protective member.

[A10]

A solar battery module which includes an encapsulating layer between a light-incident surface protective member and a back surface protective member, and is formed by encapsulating solar battery elements in the encapsulating layer, in which the encapsulating layer includes a first encapsulating layer and a second encapsulating layer, a volume resistivity of the first encapsulating layer, which is based on JIS K6911 and is measured at a temperature of 100° C. with an applied voltage of 500 V, is higher than a volume resistivity of the second encapsulating layer, and the second encapsulating sheet has at least one polar group selected from a carboxyl group, an ester group, a hydroxyl group, an amino group, and an acetal group

[A11]

The solar battery module according to [A10], in which the encapsulating layer is formed of the sheet set for encapsulating a solar battery according to any one of [A1] to [A9], the first encapsulating layer is formed by crosslinking the first encapsulating sheet, and the second encapsulating layer is formed by crosslinking the second encapsulating sheet.

[A12]

The solar battery module according to [A10] or [A11], in which the first encapsulating layer is provided between the light-incident surface protective member and the solar battery elements.

[B1]

A pair of solar battery encapsulating sheets including:

a first encapsulating sheet for being disposed on a light-incident surface of a solar battery; and a second encapsulating sheet for being disposed on aback surface of the solar battery;

in which the first encapsulating sheet and the second encapsulating sheets are made of a resin composition containing a crosslinkable resin, when the first encapsulating sheet and the second encapsulating sheet are subjected to a crosslinking treatment in which the first encapsulating sheet and the second encapsulating sheet are heated and depressurized at 150° C. and 250 Pa for three minutes, and then are heated and pressurized at 150° C. and 100 kPa for 15 minutes, a volume resistivity of the crosslinking-treated first encapsulating sheet, which is based on JIS K6911 and is measured at a temperature of 100° C. with an applied voltage of 500 V, is higher than a volume resistivity of the crosslinking-treated second encapsulating sheet.

[B2]

The solar battery encapsulating sheet according to [B1], in which a ratio ($R_1/R_2$) of a volume resistivity $R_1$ (Ω·cm) of the crosslinked first encapsulating sheet to a volume resistivity $R_2$ (Ω·cm) of the crosslinked second encapsulating sheet is in a range of $1 \times 10^1$ to $1 \times 10^{10}$.

[B3]

The solar battery encapsulating sheet according to [B1] or [B2], in which, when the second encapsulating sheet crosslinked by being heated and depressurized at 150° C. and 250 Pa for three minutes, and then being heated and pressurized at 150° C. and 100 kPa for 15 minutes is immersed in acetone at 23° C. for one hour, an acetone-absorbing ratio of the crosslinked second encapsulating sheet is in a range of 7 weight % to 400 weight % with respect to a weight of the crosslinked second encapsulating sheet before being immersed in acetone.

[B4]

The solar battery encapsulating sheet according to [B3], in which, the acetone-absorbing ratio of the crosslinked second encapsulating sheet is greater than the acetone-absorbing ratio of the crosslinked first encapsulating sheet when the first encapsulating sheet crosslinked by being heated and depressurized at 150° C. and 250 Pa for three minutes, and then being heated and pressurized at 150° C. and 100 kPa for 15 minutes is immersed in acetone at 23° C. for one hour.

[B5]

The solar battery encapsulating sheet according to [B4], in which a difference ($A_2-A_1$) between an acetone-absorbing ratio ($A_2$) of the crosslinked second encapsulating sheet and an acetone-absorbing ratio ($A_1$) of the crosslinked first encapsulating sheet is in a range of 10 to 170

[B6]

The solar battery encapsulating sheet according to any one of [B1] to [B5], in which, when the second encapsulating sheet crosslinked by being heated and depressurized at 150° C. and 250 Pa for three minutes, and then being heated and pressurized at 150° C. and 100 kPa for 15 minutes is immersed in t-butanol at 30° C. for one hour, a t-butanol-absorbing ratio of the crosslinking-treated second encapsulating sheet is in a range of 4 weight % to 30 weight % with respect to the weight of the crosslinking-treated second encapsulating sheet before being immersed in t-butanol.

[B7]

The solar battery encapsulating sheet according to [B6], in which, the t-butanol-absorbing ratio of the crosslinking-treated second encapsulating sheet is greater than the t-butanol-absorbing ratio of the crosslinking-treated first encapsulating sheet when the first encapsulating sheet crosslinked by being heated and depressurized at 150° C. and 250 Pa for three minutes, and then being heated and pressurized at 150° C. and 100 kPa for 15 minutes is immersed in t-butanol at 30° C. for one hour.

[B8]

The solar battery encapsulating sheet according to [B7], in which a difference ($B_2-B_1$) between a t-butanol-absorbing ratio ($B_2$) of the crosslinked second encapsulating sheet and a t-butanol-absorbing ratio ($B_1$) of the crosslinked first encapsulating sheet is in a range of 5 to 40.

[B9]

The solar battery encapsulating sheet according to any one of [B1] to [B8], in which the volume resistivity of the crosslinked first encapsulating sheet is in a range of $1\times10^{13}$ Ω·cm to $1\times10^{18}$ Ω·cm.

[B10]

The solar battery encapsulating sheet according to any one of [B1] to [B9], in which the volume resistivity of the crosslinked second encapsulating sheet is in a range of $1\times10^{8}$ Ω·cm to $1\times10^{16}$ Ω·cm.

[B11]

The solar battery encapsulating sheet according to any one of [B1] to [B10], in which the first encapsulating sheet includes an ethylene-based copolymer as the crosslinkable resin.

[B12]

The solar battery encapsulating sheet according to any one of [B1] to [B11], in which the second encapsulating sheet contains a resin selected from a group consisting of an ethylene/α-olefin copolymer, an ethylene/polar monomer copolymer, and polyvinyl butyral as the crosslinkable resin.

[B13]

The solar battery encapsulating sheet according to [B11] or [B12], in which at least one of the first encapsulating sheet and the second encapsulating sheet contains an ethylene-based copolymer as a crosslinkable resin, and the ethylene-based copolymer is a resin selected from a group consisting of an ethylene/α-olefin copolymer and an ethylene/polar monomer copolymer.

[B14]

The solar battery encapsulating sheet according to [B13], in which at least one of the first encapsulating sheet and the second encapsulating sheet contains an ethylene/α-olefin copolymer as the crosslinkable resin, and the ethylene/α-olefin copolymer satisfies the following a1) to a4), a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;

a2) MFR, which is based on ASTM D1238 and is measured under conditions of a temperature of 190° C. and a load of 2.16 kg, is in a range of 5 g/10 minutes to 50 g/10 minutes;

a3) a density, which is measured on the basis of ASTM D1505, is in a range of 0.865 g/cm$^3$ to 0.884 g/cm$^3$; and a4) a shore A hardness, which is measured on the basis of ASTM D2240, is in a range of 60 to 85.

[B15]

The solar battery encapsulating sheet according to [B14], in which the ethylene/α-olefin copolymer further satisfies the following a5), a5) a content of an aluminum element in the ethylene/α-olefin copolymer is in a range of 10 ppm to 500 ppm.

[B16]

The solar battery encapsulating sheet according to any one of [B13] to [B15], in which at least one of the first encapsulating sheet and the second encapsulating sheet contains an ethylene/polar monomer copolymer as the crosslinkable resin, and the ethylene/polar monomer copolymer is at least one selected from a group consisting of an ethylene/unsaturated carboxylic acid copolymer, an ethylene/unsaturated carboxylic acid anhydride copolymer, an ethylene/unsaturated carboxylic acid ester copolymer, an ethylene/unsaturated carboxylic acid ester/unsaturated carboxylic acid copolymer, an ethylene/unsaturated glycidyl ester copolymer, an ethylene/unsaturated glycidyl ether copolymer, an ethylene/unsaturated glycidyl ester/unsaturated carboxylic acid ester copolymer, an ethylene/unsaturated glycidyl ether/unsaturated carboxylic acid ester copolymer, and an ethylene/vinyl ester copolymer.

[B17]

The solar battery encapsulating sheet according to [B16], in which the ethylene/polar monomer copolymer is an ethylene/vinyl acetate copolymer.

[B18]

The solar battery encapsulating sheet according to [B17], in which a content of vinyl acetate in the ethylene/vinyl acetate copolymer is in a range of 15 weight % to 47 weight % with respect to the entire ethylene/vinyl acetate copolymer.

[B19]

The solar battery encapsulating sheet according to any one of [B16] to [B18], in which MFR of the ethylene/polar monomer copolymer, which is based on ASTM D1238 and is measured under conditions of a temperature of 190° C. and a load of 2.16 kg, is in a range of 5 g/10 minutes to 50 g/10 minutes.

[B20]

The solar battery encapsulating sheet according to any one of [B1] to [B19], in which the resin composition contains a silane coupling agent, and a content of the silane coupling agent is in a range of 0.1 parts by weight to 2.0 parts by weight with respect to 100 parts by weight of the crosslinkable resin.

[B21]

The solar battery encapsulating sheet according to any one of [B1] to [B20], in which the resin composition contains an organic peroxide, and a content of the organic peroxide is in a range of 0.1 parts by weight to 2.0 parts by weight with respect to 100 parts by weight of the crosslinkable resin.

[B22]

The solar battery encapsulating sheet according to any one of [B1] to [B21], in which the resin composition contains at least one selected from a group consisting of an ultraviolet absorber, a light stabilizer, and a heat-resistant stabilizer, and a content of at least one selected from a group consisting of the ultraviolet absorber, the light stabilizer, and the heat-resistant stabilizer is in a range of 0.005 parts by weight to 5 parts by weight with respect to 100 parts by weight of the crosslinkable resin.

[B23]

The solar battery encapsulating sheet according to any one of [B1] to [B22], in which the resin composition contains a crosslinking aid, and a content of the crosslinking aid is in a range of 0.05 parts by weight to 5 parts by weight with respect to 100 parts by weight of the crosslinkable resin.

[B24]

A solar battery module which includes an encapsulating layer between a light-incident surface protective member and a back surface protective member, and is formed by encapsulating solar battery elements in the encapsulating layer, in which the encapsulating layer includes a light-incident surface encapsulating layer disposed between the light-incident surface protective member and the solar battery elements, and a back surface encapsulating layer disposed between the back surface protective member and the solar battery elements, and when a volume resistivity of the light-incident surface encapsulating layer and the back surface encapsulating layer is measured on the basis of JIS K6911 at a temperature of 100° C. with an applied voltage of 500 V, the volume resistivity of the light-incident surface encapsulating layer is higher than a volume resistivity of the back surface encapsulating sheet.

[B25]

The solar battery module according to [B24], in which the encapsulating layer is formed of the solar battery encapsulating sheet according to any one of [B1] to [B23], the light-incident surface encapsulating layer is formed by crosslinking the first encapsulating sheet, and the back surface encapsulating layer is formed by crosslinking the second encapsulating sheet.

The invention claimed is:

1. A sheet set for encapsulating a solar battery comprising:
a first encapsulating sheet and a second encapsulating sheet which are disposed between a light-incident surface protective member and a back surface protective member, and are used to encapsulate solar battery elements,
wherein, when the first encapsulating sheet and the second encapsulating sheet are subjected to a heating and pressurization treatment in which the first encapsulating sheet and the second encapsulating sheet are heated and depressurized at 150° C. and 250 Pa for three minutes, and then are heated and pressurized at 150° C. and 100 kPa for 15 minutes, a volume resistivity of the heated and pressurized first encapsulating sheet, which is based on JIS K6911 and is measured at a temperature of 100° C. with an applied voltage of 500 V, is higher than a volume resistivity of the heated and pressurized second encapsulating sheet,
the first encapsulating sheet is disposed between the light-incident surface protective member and the solar battery elements, and
the second encapsulating sheet has at least one polar group selected from a carboxyl group, an ester group, a hydroxyl group, an amino group, and an acetal group,
wherein the first encapsulating sheet contains an ethylene/α-olefin copolymer and an organic peroxide,
wherein, when the heated and pressurized second encapsulating sheet is immersed in acetone at 23° C. for one hour, an acetone-absorbing ratio of the heated and pressurized second encapsulating sheet is in a range of 7 weight % to 400 weight % with respect to a weight of the heated and pressurized second encapsulating sheet before being immersed in acetone,
wherein at least part of the first encapsulating sheet and the second encapsulating sheet are in direct contact with each other inside the solar battery,
wherein the ethylene/α-olefin copolymer satisfies the following a3), a3) a density, which is measured on the basis of ASTM D1505, is in a range of 0.865 g/cm$^3$ to 0.884 g/cm$^3$,
wherein the ethylene/α-olefin copolymer is a copolymer consisting of ethylene and α-olefin selected from a group consisting of propylene, 1-butene, 2-butene, 1-pentene, 3-methyl-1-butene, 3,3-dimethyl-1-butene, 1-hexene, 4-methyl-1-pentene, 3-methyl-1-pentene, 1-octene, 1-decene, and 1-dodecene,
wherein a ratio ($R_1/R_2$) of a volume resistivity $R_1$ (Ω·cm) of the heated and pressurized first encapsulating sheet to a volume resistivity $R_2$ (Ω·cm) of the heated and pressurized second encapsulating sheet is in a range of $1\times10^{10}$ to $1\times10^{10}$, and wherein the second encapsulating sheet contains an ethylene-vinyl acetate polymer or a modified polyvinyl butyral.

2. The sheet set for encapsulating a solar battery according to claim 1,
wherein, the acetone-absorbing ratio of the heated and pressurized second encapsulating sheet is greater than the acetone-absorbing ratio of the heated and pressurized first encapsulating sheet when the heated and pressurized first encapsulating sheet is immersed in acetone at 23° C. for one hour.

3. The sheet set for encapsulating a solar battery according to claim 1,
wherein, when the heated and pressurized second encapsulating sheet is immersed in t-butanol at 30° C. for one hour, a t-butanol-absorbing ratio of the heated and pressurized second encapsulating sheet is in a range of 4 weight % to 30 weight % with respect to the weight of the heated and pressurized second encapsulating sheet before being immersed in t-butanol.

4. The sheet set for encapsulating a solar battery according to claim 3,
wherein, the t-butanol-absorbing ratio of the heated and pressurized second encapsulating sheet is greater than the t-butanol-absorbing ratio of the heated and pressurized first encapsulating sheet when the heated and pressurized first encapsulating sheet is immersed in t-butanol at 30° C. for one hour.

5. The sheet set for encapsulating a solar battery according to claim 1,
wherein the volume resistivity of the heated and pressurized first encapsulating sheet is in a range of $1\times10^{13}$ Ω·cm to $1\times10^{18}$ Ω·cm, and
the volume resistivity of the heated and pressurized second encapsulating sheet is in a range of $1\times10^{8}$ Ω·cm to $1\times10^{18}$ Ω·cm.

6. The sheet set for encapsulating a solar battery according to claim 1,
wherein the second encapsulating sheet contains an ethylene-based copolymer as a crosslinkable resin, and the ethylene-based copolymer is an ethylene/polar monomer copolymer.

7. The sheet set for encapsulating a solar battery according to claim 6,
wherein at least one of the first encapsulating sheet and the second encapsulating sheet contains an organic peroxide, and a content of the organic peroxide is in a range of 0.1 parts by weight to 1.2 parts by weight with respect to 100 parts by weight of the crosslinkable resin.

8. The sheet set for encapsulating a solar battery according to claim 1,
wherein the ethylene/α-olefin copolymer further satisfies the following a1), a2) and a4),
a1) a content ratio of a structural unit derived from ethylene is in a range of 80 mol % to 90 mol %, and a content ratio of a structural unit derived from an α-olefin having 3 to 20 carbon atoms is in a range of 10 mol % to 20 mol %;
a2) MFR, which is based on ASTM D1238 and is measured under conditions of a temperature of 190° C. and a load of 2.16 kg, is in a range of 0.1 g/10 minutes to 50 g/10 minutes; and
a4) a shore A hardness, which is measured on the basis of ASTM D2240, is in a range of 60 to 85.

9. The sheet set for encapsulating a solar battery according to claim 8, wherein the ethylene/α-olefin copolymer further satisfies the following a5), a5) a content of an aluminum element in the ethylene/α-olefin copolymer is in a range of 10 ppm to 500 ppm.

10. The sheet set for encapsulating a solar battery according to claim 6, wherein the ethylene/polar monomer copolymer is at least one selected from a group consisting of an ethylene/unsaturated carboxylic acid copolymer, an ethylene/unsaturated carboxylic acid anhydride copolymer, an ethylene/unsaturated carboxylic acid ester copolymer, an ethylene/unsaturated carboxylic acid ester/unsaturated carboxylic acid copolymer, an ethylene/unsaturated glycidyl ester copolymer, an ethylene/unsaturated glycidyl ether copolymer, an ethylene/unsaturated glycidyl ester/unsaturated carboxylic acid ester copolymer, an ethylene/unsaturated glycidyl ether/unsaturated carboxylic acid ester copolymer, and an ethylene/vinyl ester copolymer.

11. The sheet set for encapsulating a solar battery according to claim 10, wherein the ethylene/polar monomer copolymer is an ethylene/vinyl acetate copolymer, and a content of vinyl acetate in the ethylene/vinyl acetate copolymer is in a range of 15 weight % to 47 weight % with respect to the entire ethylene/vinyl acetate copolymer.

12. The sheet set for encapsulating a solar battery according to claim 1, wherein the second encapsulating sheet is disposed between the back surface protective member and the solar battery elements.

13. The sheet set for encapsulating a solar battery according to claim 1, wherein the first encapsulating sheet and the second encapsulating sheet are laminated and disposed between the light-incident surface protective member and the solar battery elements.

14. The sheet set for encapsulating a solar battery according to claim 1, further comprising:

a plurality of the first encapsulating sheets, wherein the second encapsulating sheet is sandwiched in the first encapsulating sheets and is disposed between the light-incident surface protective member and the back surface protective member.

15. The sheet set for encapsulating a solar battery according to claim 1, further comprising:

a plurality of the second encapsulating sheets, wherein the first encapsulating sheet is sandwiched in the second encapsulating sheets and is disposed between the light-incident surface protective member and the back surface protective member.

16. A solar battery module which includes an encapsulating layer between a light-incident surface protective member and a back surface protective member, and is formed by encapsulating solar battery elements in the encapsulating layer, wherein the encapsulating layer includes a first encapsulating layer and a second encapsulating layer, a volume resistivity of the first encapsulating layer, which is based on JIS K6911 and is measured at a temperature of 100° C. with an applied voltage of 500 V, is higher than a volume resistivity of the second encapsulating layer, the second encapsulating layer has at least one polar group selected from a carboxyl group, an ester group, a hydroxyl group, an amino group, and an acetal group, and the first encapsulating layer is provided between the light-incident surface protective member and the solar battery elements, wherein the encapsulating layer including the first encapsulating layer and the second encapsulating layer is formed of the sheet set for encapsulating a solar battery according to claim 1, wherein the first encapsulating layer is formed by crosslinking the first encapsulating sheet, and the second encapsulating layer is formed by crosslinking the second encapsulating sheet, wherein at least part of the first encapsulating layer and the second encapsulating layer are in direct contact with each other.

17. The solar battery module according to claim 16, wherein the second encapsulating layer is provided between the back surface protective member and the solar battery elements.

18. A method using the sheet set for encapsulating a solar battery according to claim 1, wherein the sheet set is used for forming of an encapsulating layer inside a solar battery, the solar battery included the encapsulating layer between a light-incident surface protective member and a back surface protective member, and is formed by encapsulating solar battery elements in the encapsulating layer, wherein the encapsulating layer includes a first encapsulating layer and a second encapsulating layer, the first encapsulating layer is provided between the light-incident surface protective member and the solar battery elements, the first encapsulating sheet is used for forming of the first encapsulating layer, and the second encapsulating sheet is used for forming the second encapsulating layer, wherein the sheet set is used so that at least part of the first encapsulating sheet and the second encapsulating sheet are in direct contact with each other inside the solar battery.

19. The sheet set for encapsulating a solar battery according to claim 1, wherein the ratio ($R_1/R_2$) is in a range of $1\times10^1$ to $1\times10^5$.

* * * * *